US009595581B2

(12) United States Patent
Kuhn et al.

(10) Patent No.: US 9,595,581 B2
(45) Date of Patent: Mar. 14, 2017

(54) SILICON AND SILICON GERMANIUM NANOWIRE STRUCTURES

(71) Applicant: Intel Corporation, Santa Clara, CA (US)

(72) Inventors: Kelin J. Kuhn, Aloha, OR (US); Seiyon Kim, Portland, OR (US); Rafael Rios, Portland, OR (US); Stephen M. Cea, Hillsboro, OR (US); Martin D. Giles, Portland, OR (US); Annalisa Cappellani, Portland, OR (US); Titash Rakshit, Hillsboro, OR (US); Peter Chang, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/789,856

(22) Filed: Jul. 1, 2015

(65) Prior Publication Data

US 2015/0303258 A1 Oct. 22, 2015

Related U.S. Application Data

(62) Division of application No. 14/274,592, filed on May 9, 2014, now Pat. No. 9,129,829, which is a division (Continued)

(51) Int. Cl.
*H01L 29/06* (2006.01)
*H01L 29/10* (2006.01)
(Continued)

(52) U.S. Cl.
CPC .......... *H01L 29/0673* (2013.01); *B82Y 10/00* (2013.01); *H01L 21/76224* (2013.01);
(Continued)

(58) Field of Classification Search
CPC ....... H01L 29/06; H01L 29/10; H01L 29/423; H01L 29/78; H01L 29/15; H01L 29/165; H01L 27/12; H01L 27/092
(Continued)

(56) References Cited

U.S. PATENT DOCUMENTS 6,770,516 B2 8/2004 Wu et al.
6,855,588 B1 2/2005 Liao et al.
(Continued)

FOREIGN PATENT DOCUMENTS

JP 2004-172178 6/2004
JP 2004/336052 11/2004
(Continued)

OTHER PUBLICATIONS

Notice of Second Office Action from the Chinese State Intellectual Property Office for Chinese Patent Application No. 201180058034.0 dated Dec. 7, 2015, 9 pages and English Translation thereof.
(Continued)

*Primary Examiner* — Sheng Zhu
(74) *Attorney, Agent, or Firm* — Blakely, Sokoloff, Taylor & Zafman LLP

(57) ABSTRACT

Methods of forming microelectronic structures are described. Embodiments of those methods include forming a nanowire device comprising a substrate comprising source/drain structures adjacent to spacers, and nanowire channel structures disposed between the spacers, wherein the nanowire channel structures are vertically stacked above each other.

19 Claims, 28 Drawing Sheets

Related U.S. Application Data of application No. 12/958,179, filed on Dec. 1, 2010, now Pat. No. 8,753,942.

(51) Int. Cl.

| | | |
|---|---|---|
| *H01L 29/423* | (2006.01) | |
| *H01L 29/78* | (2006.01) | |
| *H01L 29/165* | (2006.01) | |
| *H01L 29/16* | (2006.01) | |
| *H01L 27/12* | (2006.01) | |
| *H01L 27/092* | (2006.01) | |
| *B82Y 10/00* | (2011.01) | |
| *H01L 21/762* | (2006.01) | |
| *H01L 29/417* | (2006.01) | |
| *H01L 29/66* | (2006.01) | |
| *H01L 29/775* | (2006.01) | |
| *H01L 29/786* | (2006.01) | |

(52) U.S. Cl.
CPC ...... *H01L 27/0922* (2013.01); *H01L 27/1203* (2013.01); *H01L 29/0676* (2013.01); *H01L 29/1033* (2013.01); *H01L 29/16* (2013.01); *H01L 29/165* (2013.01); *H01L 29/41733* (2013.01); *H01L 29/42392* (2013.01); *H01L 29/66439* (2013.01); *H01L 29/66742* (2013.01); *H01L 29/66795* (2013.01); *H01L 29/775* (2013.01); *H01L 29/785* (2013.01); *H01L 29/7848* (2013.01); *H01L 29/78618* (2013.01); *H01L 29/78654* (2013.01); *H01L 29/78684* (2013.01); *H01L 29/78696* (2013.01)

(58) Field of Classification Search
USPC .... 257/24, 329, E21.118, E21.411, E21.218; 438/151, 285, 329
See application file for complete search history.

(56) References Cited

U.S. PATENT DOCUMENTS

| | | |
|---|---|---|
| 7,026,199 B2 | 4/2006 | Lee |
| 7,074,662 B2 | 7/2006 | Lee et al. |
| 7,402,483 B2 | 7/2008 | Yun et al. |
| 7,892,945 B2 | 2/2011 | Bedell et al. |
| 8,084,308 B2 | 12/2011 | Chang et al. |
| 2004/0217434 A1 | 11/2004 | Lee et al. |
| 2004/0262690 A1 | 12/2004 | Coronel et al. |
| 2005/0095793 A1 | 5/2005 | Lee |
| 2005/0266645 A1 | 12/2005 | Park |
| 2006/0024874 A1 | 2/2006 | Yu et al. |
| 2006/0216897 A1 | 9/2006 | Lee et al. |
| 2007/0004124 A1 | 1/2007 | Suk et al. |
| 2007/0017439 A1 | 1/2007 | Xianyu et al. |
| 2007/0196973 A1 | 8/2007 | Park |
| 2008/0121932 A1 | 5/2008 | Ranade |
| 2008/0135949 A1 | 6/2008 | Lo et al. |
| 2008/0179664 A1* | 7/2008 | Rao .............................. 257/329 |
| 2008/0237575 A1 | 10/2008 | Jin et al. |
| 2008/0251381 A1* | 10/2008 | Shibata et al. ................ 204/483 |
| 2008/0277691 A1 | 11/2008 | Ernst et al. |
| 2009/0065853 A1 | 3/2009 | Hanafi |
| 2010/0207208 A1 | 8/2010 | Bedell et al. |
| 2010/0264497 A1 | 10/2010 | Chang et al. |
| 2010/0295021 A1* | 11/2010 | Chang et al. .................. 257/24 |
| 2010/0297816 A1 | 11/2010 | Bedell et al. |
| 2011/0012090 A1 | 1/2011 | Singh et al. |
| 2011/0031473 A1 | 2/2011 | Chang et al. |
| 2011/0073842 A1 | 3/2011 | Liu et al. |
| 2011/0278543 A1* | 11/2011 | Bangsaruntip et al. ........ 257/24 |
| 2012/0129354 A1 | 5/2012 | Luong |

FOREIGN PATENT DOCUMENTS

| | | |
|---|---|---|
| JP | 2005-340810 | 12/2005 |
| JP | 2009-522760 | 6/2009 |
| JP | 2010-501122 | 1/2010 |
| WO | WO 2008/036681 A1 | 3/2008 |
| WO | WO 2009/151001 A1 | 12/2009 |

OTHER PUBLICATIONS

Extended European Search Report for European Patent No. 15166618.7-1552 dated Oct. 9, 2015.
Notice of Second Office Action from the Chinese State Intellectual Property Office for Chinese Patent Application No. 201180058034.0 dated Dec. 7, 2015, 9 pages.
Notice of Preliminary Rejection (Non-Final) from the Korean Intellectual Property Office (KIPO) for Korean Patent Application No. 10-2015-7-17708 dated Oct. 7, 2015 and English Translation thereof.
International Search Report and Written Opinion mailed Jul. 27, 2012 for PCT/US2011/062059 filed Nov. 23, 2011.
Decision to Refuse from the Japanese Patent Office dated Mar. 24, 2015, Japanese Patent Application No. 2013-541049 and English translation thereof.
Notice of Preliminary Rejection from the Korean Patent Office dated Oct. 28, 2014, Korean Patent Application No. 10-2013-7014162 and English translation thereof.
Extended European Search Report for Application No. 11844167.4-1552/2647038, PCT/US2011/062059 and Supplementary European Search Report (Art. 153(7) EPC) dated Dec. 5, 2014, 6 pages.
Notice of First Office Action from the Chinese Patent Office dated Apr. 8, 2015, Chinese Patent Application No. 2011800580340 and English Translation thereof.
Notice of Allowance from the Korean Intellectual Property Office (KIPO) for Korean Patent Application No. 10-2014-7016438 dated Nov. 2, 2015, 3 pages.
Notice of Preliminary Rejection from the Korean State Intellectual Property Office (KIPO) for Korean Patent Application No. 10-2015-7034821 dated Mar. 22, 2016 and English Translation thereof.
Notice of Third Office Action from the Chinese State Intellectual Property Office for Chinese Patent Application No. 201180058034.0 dated Apr. 15, 2016 and English Translation thereof.
First Office Action (4 pages) from the Japanese Patent Office for Japanese Patent Application No. 2015-14558 dated Sep. 6, 2016 and English Translation (3 pages) thereof.
Notice of Last Preliminary Amendment (4 pages) from the Korean Intellectual Property Office (KIPO) dated Sep. 22, 2016 and English Translation (4 pages) thereof.
Notice of Allowance (2 pages) from the Chinese Patent Office for Chinese Patent Application No. 201180058034.0 dated Sep. 9, 2016 and English Translation (2 pages) thereof.

* cited by examiner (a) NMOS

SILICON AND SILICON GERMANIUM NANOWIRE STRUCTURES

This is a Divisional of application Ser. No. 14/274,592 filed May 9, 2014 which a Divisional of application Ser. No. 12/958,179 filed Dec. 1, 2010 now U.S. Pat. No. 8,753,942 issued Jun. 17, 2014.

BACKGROUND

Maintaining mobility improvement and short channel control as microelectronic device dimensions scale past the 15 nm node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

BRIEF DESCRIPTION OF THE DRAWINGS

While the specification concludes with claims particularly pointing out and distinctly claiming certain embodiments, the advantages of the various embodiments can be more readily ascertained from the following description of the embodiments when read in conjunction with the accompanying drawings in which:

DETAILED DESCRIPTION

Figure 1A:
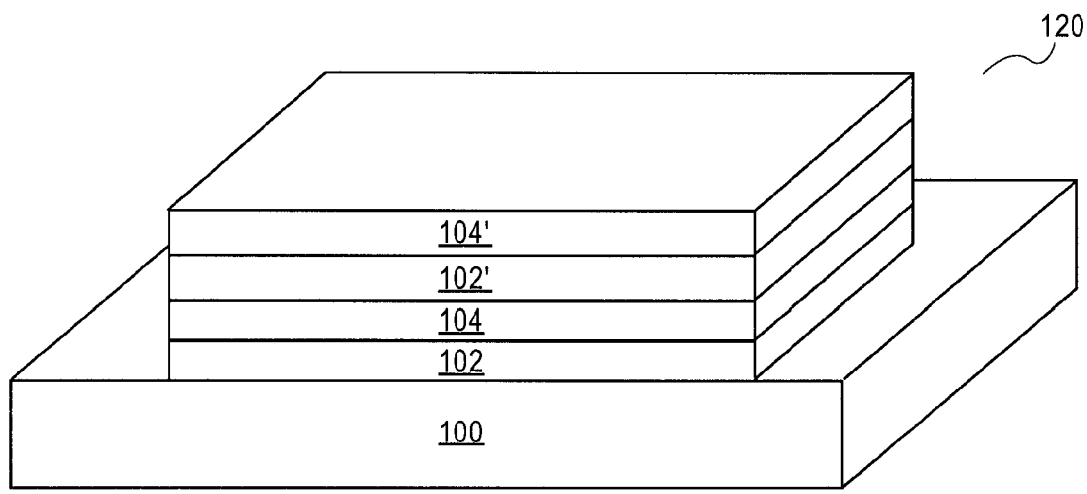
FIGS. 1a-1n represent methods of forming structures according to embodiments.

In the following detailed description, reference is made to the accompanying drawings that show, by way of illustration, the specific embodiments which may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from their spirit and scope. In addition, it is to be understood that the location or arrangement of individual elements within each disclosed embodiment may be modified without departing from their spirit and scope. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing microelectronic structures, such as nanowire device structures, are described. Those methods and structures may include forming a nanowire device comprising a substrate comprising source/drain structures comprising nanowires between the source/drain structures, wherein the nanowire channel structures are vertically stacked above each other. Various embodiments included herein enable mobility improvement and short channel control as device dimensions scale past the 15 nm node. Embodiments further enable enhanced isolation of channels from the substrate, mitigation of the capacitance associated with spacer-gap separation, and vertical architecture scaling with nanowires.

Figure 1B:
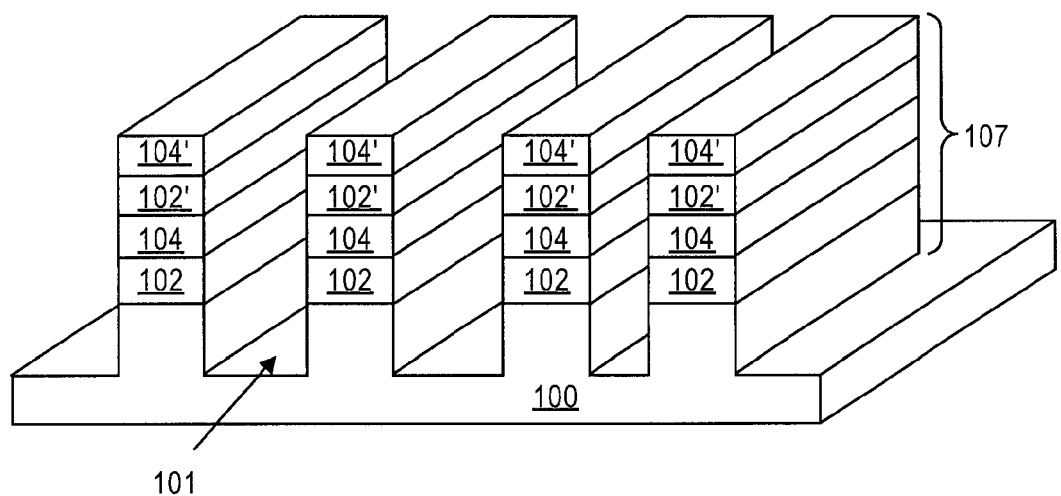
Figure 1C:
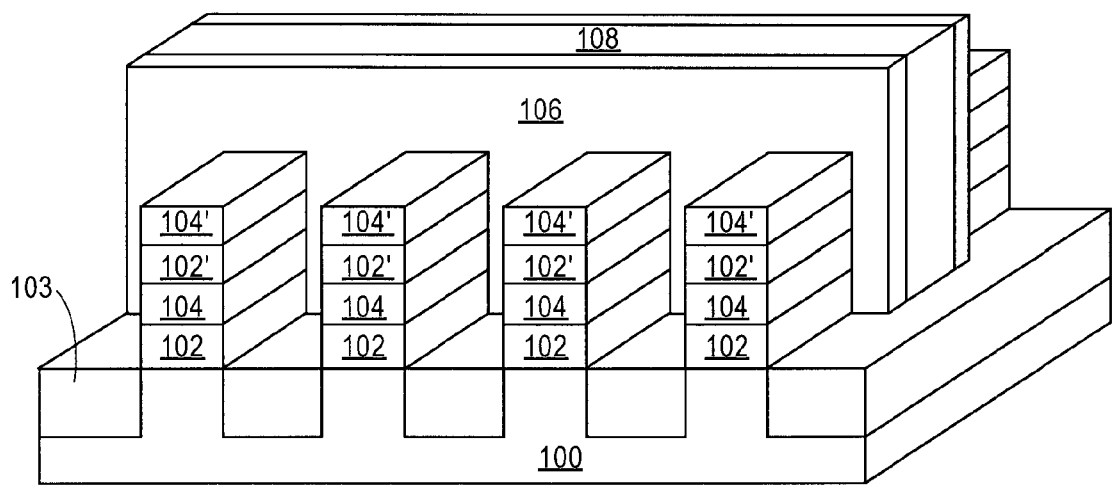
Figure 1D:
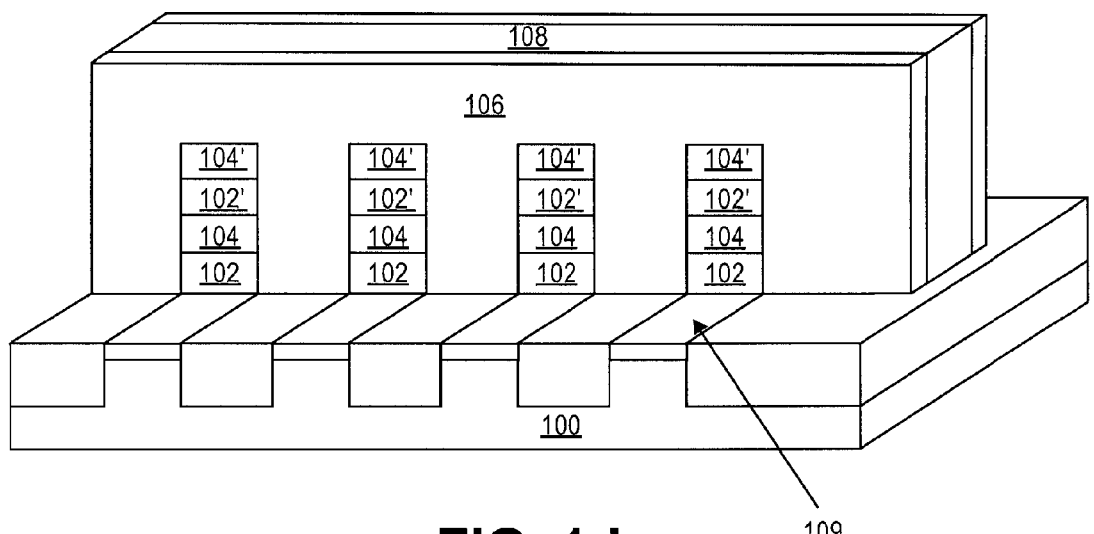
Figure 1E:
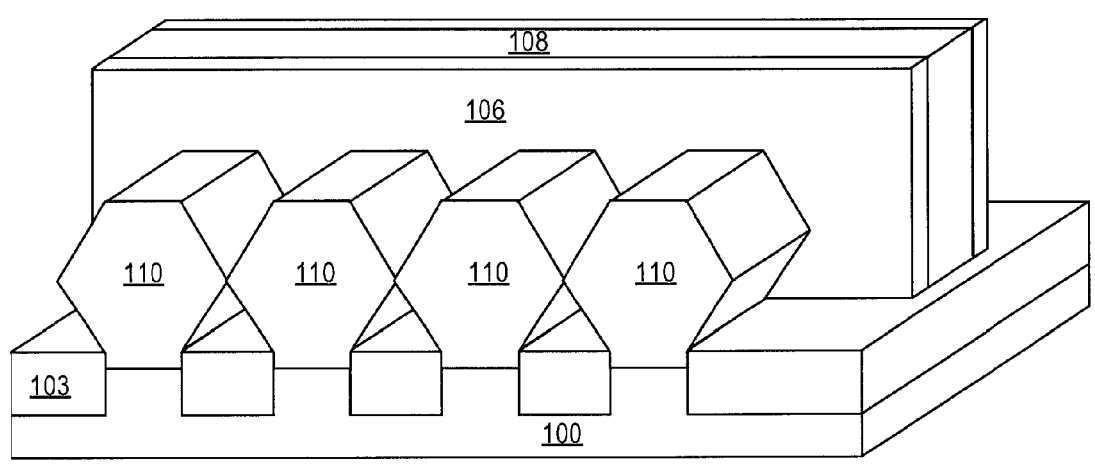
Figure 1F:
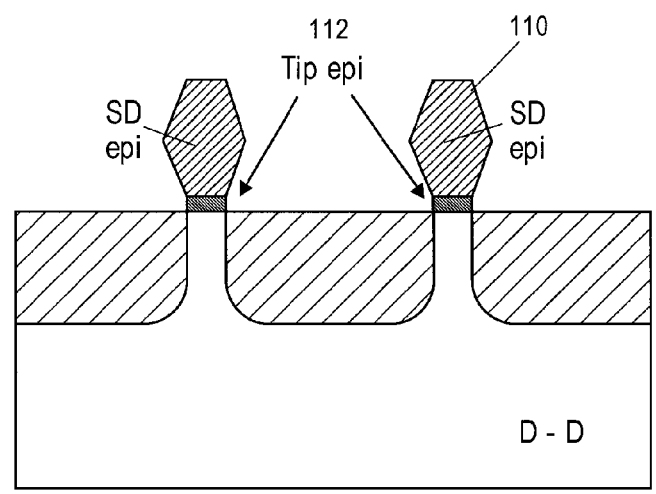
Figure 1G:
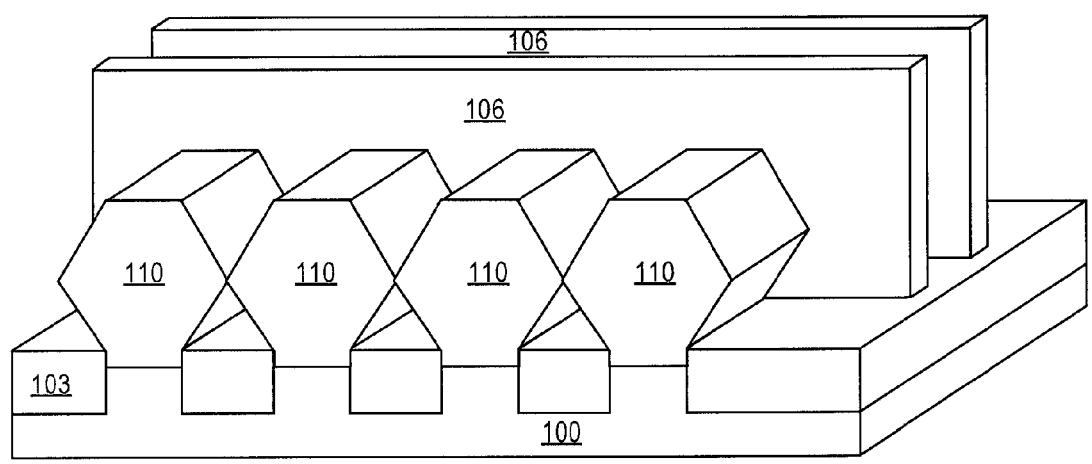
Figure 1H:
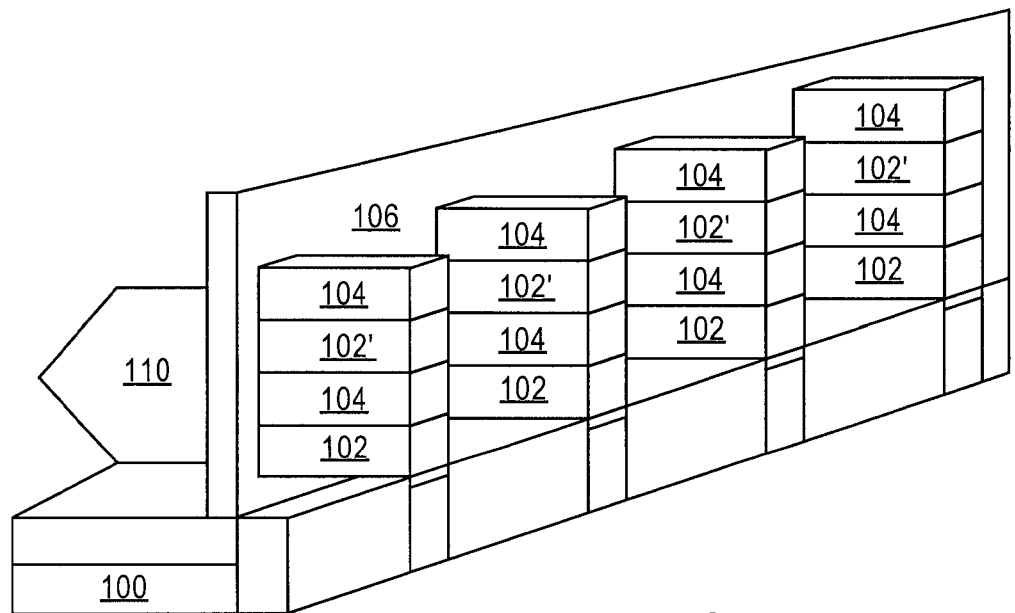
Figure 1I:
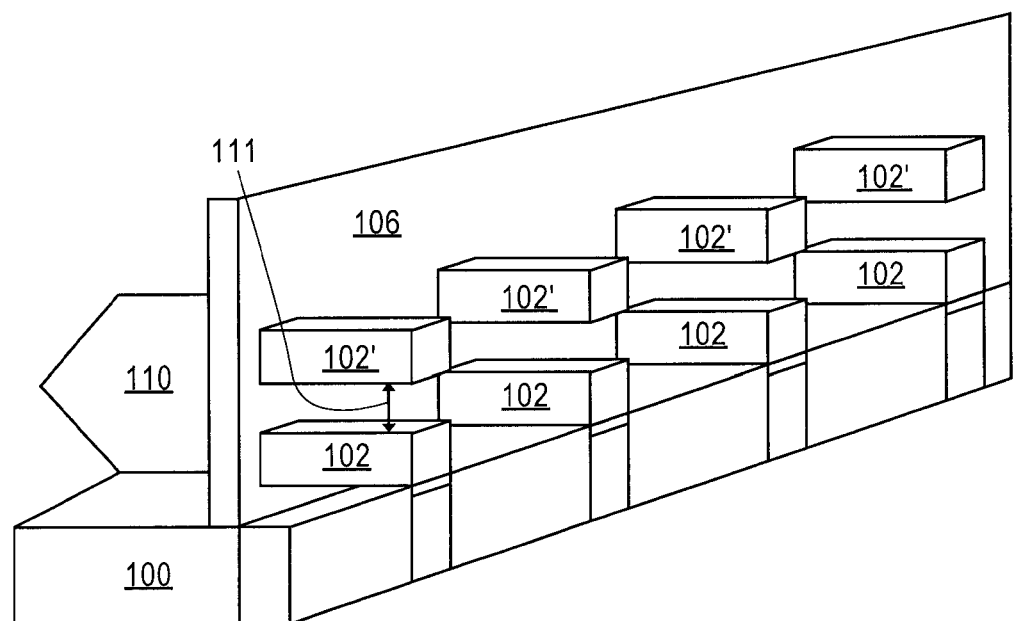
Figure 1J:
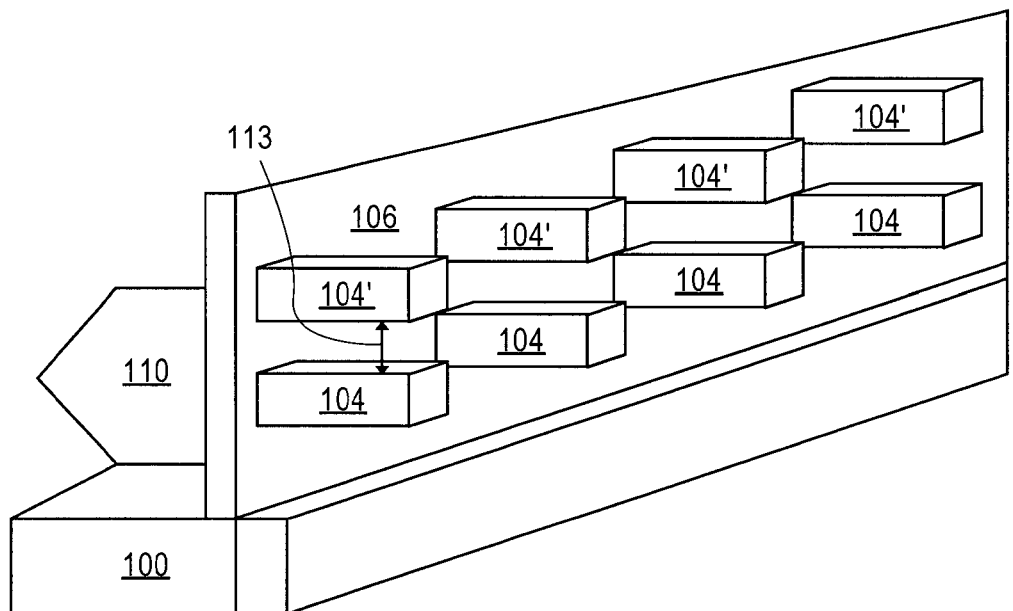
Figure 1K:
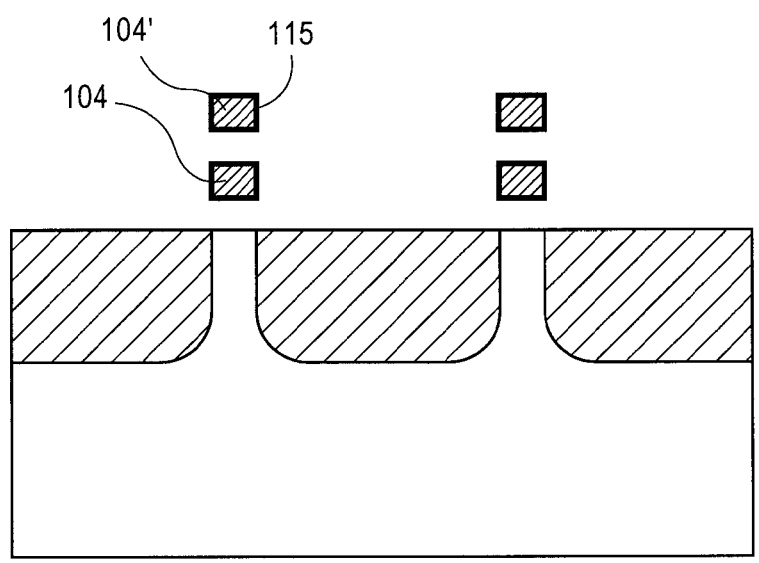
Figure 1L:
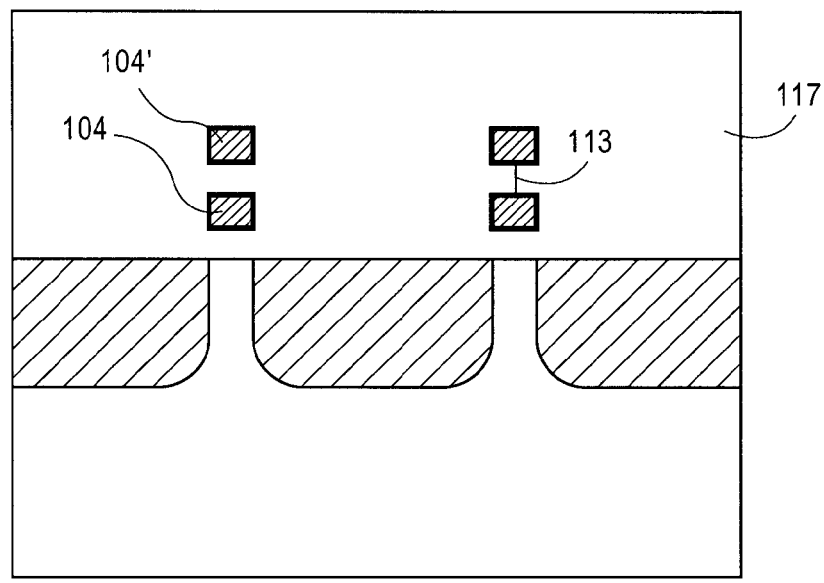
Figure 1M:
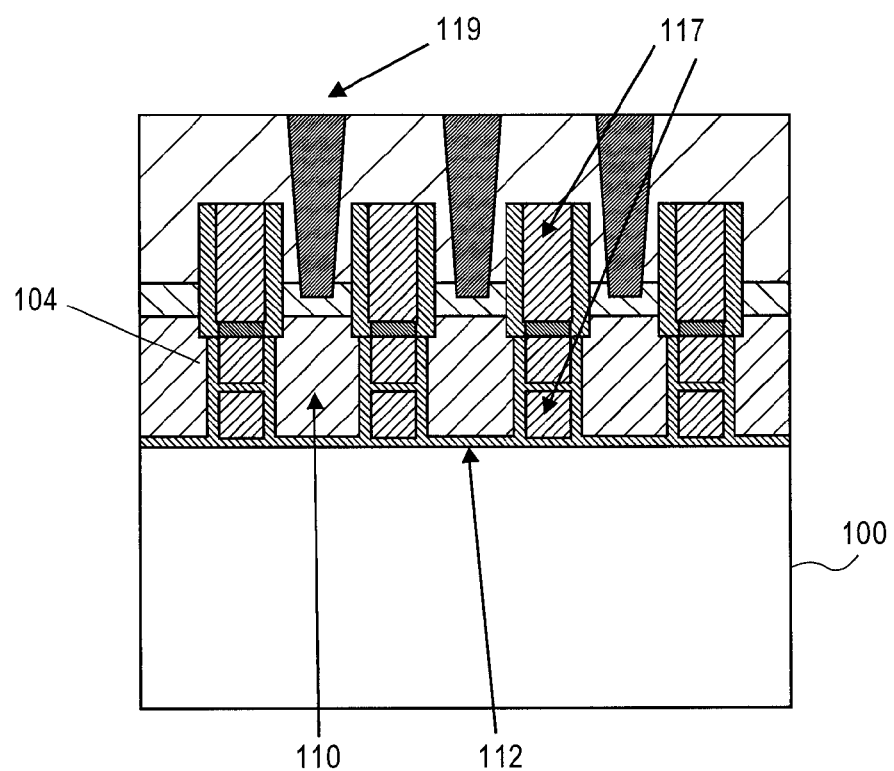
Figure 1N:
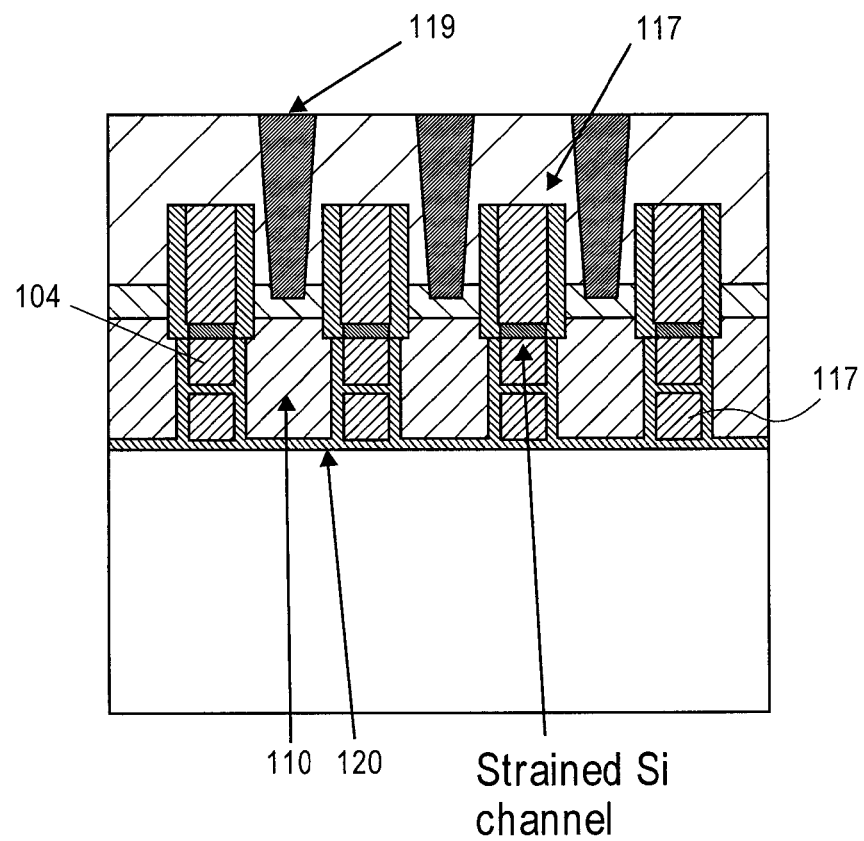

FIGS. 1a-1n illustrate embodiments of forming microelectronic structures, such as forming nanowire device structures, for example. FIG. 1a illustrates a substrate 100. In one embodiment, the substrate 100 may comprise a bulk silicon substrate 100. In other embodiments, the substrate 100 may comprise a silicon on insulator substrate (SOI) 100, but may also include any type of suitable substrate material. In an embodiment, a first silicon germanium 102 material may be grown by epitaxial growth on the substrate 100. In an embodiment, a first silicon material 104 may be epitaxially grown on the epitaxial first silicon germanium 102. A second layer of silicon germanium 102' may be formed on the first silicon layer 102, and a second layer of silicon 104' may be formed on the second silicon germanium 102'. In another embodiment, the numbers of alternating epitaxial silicon germanium layers 102/epitaxial silicon layers 104 formed on the substrate 100 may be varied, depending upon the particular application. In another embodiment, the layer order can be reversed with alternating layers of epitaxial silicon 104 and epitaxial silicon germanium 102 formed on the substrate 100.

In an embodiment, the epitaxial stack 120 of silicon germanium/silicon/silicon germanium/silicon may be patterned using conventional patterning/etching techniques (FIG. 1b). For example, the stack structure 120 may be etched at a trench etch process, such as during a shallow trench isolation (STI) process, wherein trenches 101 may be formed in the substrate 100 to form fin structures 107. Each of the fin structures formed 107 may be separated from each other by an oxide 103, that may be formed in the trenches 101.

In an embodiment, the fin structures 107 may comprise a dual channel portion of a gate all around (GAA) nanowire device. The number of channels in the device will depend on the numbers of layers in the fin structures 107. The fin structures 107 may comprise nanowire structures. Spacers 106 may be formed on and across the fin structures 107 and may be disposed orthogonally with respect to the fin structures 107 (FIG. 1c). In an embodiment, the spacers 106 may comprise any material that may be selective during process to the fin structure 107 materials.

In an embodiment, a gate electrode material 108 may be formed within/between spacers 106, and may be formed around portions of the fin structures 107 located between the spacers 106. In an embodiment the gate electrode material may be formed around portions of the fin structures 107, and the spacers 106 formed on either side of the gate. The gate 108 may comprise polysilicon, in some cases, and may comprise a sacrificial gate structure 108. In an embodiment, a portion of the fin structure 107 may be removed from the substrate 100 to expose source/drain regions 109 (FIG. 1d). In an embodiment, the portion of the fin structure 107 may be etched by a dry etch process to expose the source/drain regions 109. In an embodiment, the source/drain regions 109 may be etched to terminate on either the substrate 100 or the bottom wire (102 or 104). Optional undercut wet or dry etch processes can be utilized to remove additional materials in gate 108 region/tip overlap area depending upon the particular device needs.

In an embodiment, silicon or silicon germanium source drain structures 110 may be grown utilizing epitaxial growth techniques in the source/drain regions 109 (FIG. 1e), and may be coupled to the portions of the fin structures 107 disposed between the spacers 106. In an embodiment, the epitaxial source/drain structures 110 may be n-doped silicon for an NMOS device, or may be p-doped silicon/silicon germanium for a PMOS device, depending on the device type for the particular application. Doping may be introduced in the epitaxial process, by implant, by plasma doping, by solid source doping or by other methods as are known in the art.

The tip and source/drain junction can be engineered by combining epitaxial layers doped with different dopant species and concentration. For example, when silicon germanium source/drains are utilized to add strain in a silicon channel for a PMOS devices, a silicon etch stop layer/tip 112 may be grown first before the source/drain silicon germanium epitaxial structures 110 are grown, to avoid etching in the source/drain regions 110 during a subsequent silicon germanium etch (FIG. 1f). In other words, the PMOS tip material needs to be resistant to a subsequent silicon germanium etch process.

An interlayer dielectric (ILD) may be formed on the substrate 100 (not shown) over the source/drain structures 110 and the gate 108. and spacers 106. A top portion of the sacrificial poly gate 108 may be opened by chemical mechanical polish (CMP), in an embodiment. The sacrificial gate electrode material 108 may then be removed from between the spacer materials 106 (FIG. 1g). FIG. 1h depicts an interior view between the spacers 106, wherein the fin structure 107 is disposed in between the two spacers (only one shown). In an embodiment, the silicon layers 104, 104' may be selectively removed from the fin structure 107 to open up a gap 111 between the silicon germanium channels 102, 102' (FIG. 1i). In an embodiment, the silicon layers 104, 104' may be etched selectively with a wet etch that selectively removes the silicon 104, 104' while not etching the silicon germanium nanowire structures 102, 102'. Such etch chemistries as aqueous hydroxide chemistries, including ammonium hydroxide and potassium hydroxide, for example, may be utilized to selectively etch the silicon.

In another embodiment, the silicon germanium layers 102, 102' may be selectively removed from the fin structure 107 and from sidewalls to open a gap 113 between the silicon channel layers 104, 104' (FIG. 1j). In an embodiment, the silicon germanium 102, 102' may be etched selectively with a wet etch that selectively removes the silicon germanium while not etching the silicon nanowire channels 104, 104'. Such etch chemistries as carboxylic acid/nitric acid/HF chemistry, and citric acid/nitric acid/HF, for example, may be utilized to selectively etch the silicon germanium. Thus, either the silicon layers may be removed from the fin structure 107 to form silicon germanium nanowires 102, 102', or the silicon germanium layer may be removed from the fin structure 107 to form silicon channel nanowire 104, 104' structures in the channel region between the spacers 106, In an embodiment, both silicon and silicon germanium channel material may exist on the same wafer, in the same die, or on the same circuit, for example as NMOS Si and PMOS SiGe in an inverter structure. In an embodiment with NMOS Si and PMOS SiGe in the same circuit, the Si channel thickness (SiGe interlayer) and SiGe channel thickness (Si interlayer) may be mutually chosen to enhance circuit performance and/or circuit minimum operating voltage In an embodiment, the number of wires on different devices in the same circuit may be changed through an etch process to enhance circuit performance and/or circuit minimum operating voltage.

A gate dielectric material 115 may be formed to surround the channel region between the spacers 106. In an embodiment, the gate dielectric material 115 may comprise a high k gate electrode material, wherein the dielectric constant may comprise a value greater than about 4. In an embodiment, the gate dielectric material 115 may be formed conformally all around the silicon nanowire structures 104, 104' between the spacers 106 (FIG. 1k). In another embodiment, the gate electrode material 115 may be formed all around silicon germanium nanowire structures 102, 102' in between the spacers 106 (not shown).

A gate electrode material 117 may then be formed around the gate dielectric material 115 (FIG. 1l). The gate electrode material 117 may comprise metal gate electrode materials such as pure metal and alloys of Ti, W, Ta, Al, including nitrides such as TaN, TiN, and also including alloys with rare earths, such as Er, Dy or noble metals such as Pt. The gap 113 between the silicon nanowire structures 104, 104' may be filled with the gate electrode material 117. In another embodiment, the gap 111 between the silicon germanium nanowire structures 102, 102' may be filled with the gate electrode material 117 (not shown). In an embodiment, standard CMOS processing may be further performed on the substrate 100 to fabricate a CMOS device according to embodiments herein.

In an embodiment, an NMOS and/or a PMOS device may be formed. FIG. 1m depicts an NMOS device that may be formed (depicting a single silicon channel), wherein a trench contact 119 couples to the source drain structure 110, which may be silicon doped n+ in some cases, depending upon the particular application. A silicon epitaxial tip 112, which may be n− doped in some cases, and may be disposed between the source drain structure 110 and the substrate 100. The gate electrode material 117 may surround the silicon nanowire channel 104.

FIG. 1n depicts a PMOS device (depicting a single silicon channel 104) wherein a trench contact 119 couples to the source drain structure 110, which may be silicon germanium doped p+ in some cases, depending upon the particular application. A silicon epitaxial tip/etch stop 120, which may be p− doped in some cases, may be disposed between the source drain structure 110 and the substrate 100. The gate electrode material 117 may surround the silicon channel 104, which may comprise a strained silicon channel 104 in some cases.

In some cases, a device utilizing silicon germanium channel structures (such as those depicted in FIG. 1i for example) may have an advantage by comprising a high carrier mobility due to the silicon germanium properties. In an embodiment, a gate all around silicon germanium channel device process may be similar to the gate all around silicon channel device processing, except that the epitaxial layer stack 120 may be reversed, that is the silicon material 104 will be formed on the substrate initially, and the silicon germanium formed on the silicon. Since the silicon underlayer will be removed selective to the silicon germanium, the source/drain may comprise silicon germanium, and the etch stop under the sacrificial gate electrode material may comprise silicon germanium as well to avoid substrate etching.

Embodiments herein enable the fabrication of self-aligned gate-all-around (GAA) silicon and silicon germanium channel transistor structures and devices. Nanowire channel devices exhibit lower sub-threshold leakage due to short channel effect (SCE) reduction. Implementation of GAA SiGe high mobility channel device, for example suppress SCE effects. (GAA) devices can maximize the electrostatic gate control to the channel.

Figure 2A:
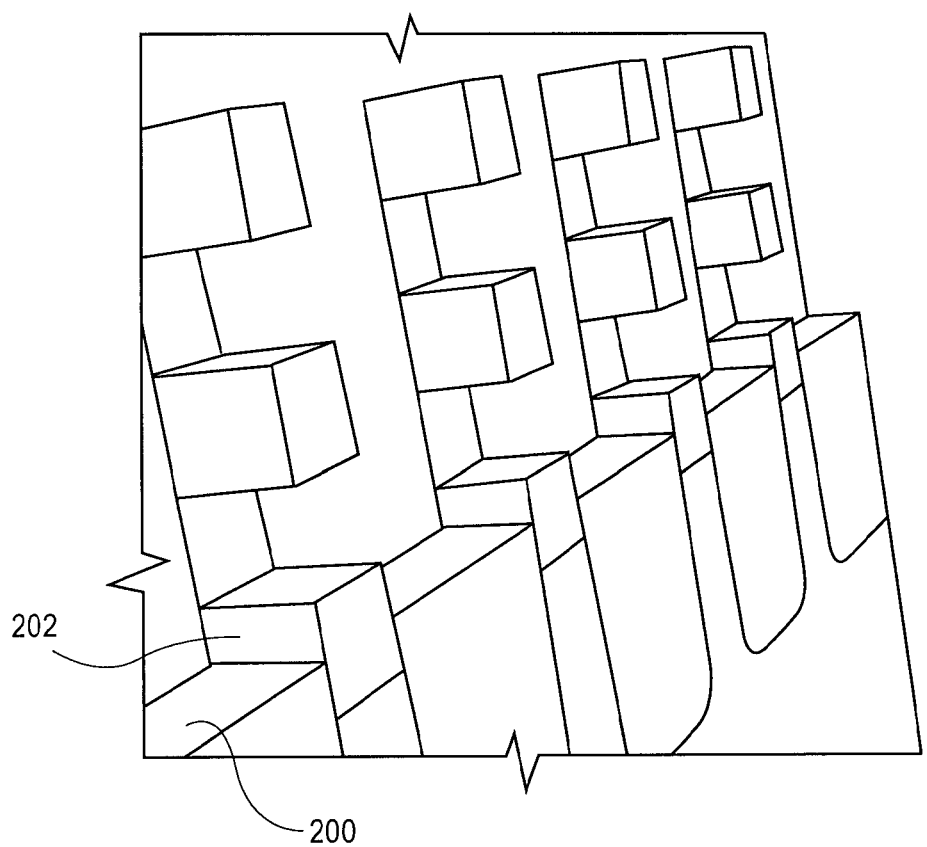
FIGS. 2a-2i represent methods of forming structures according to embodiments.
Figure 2B:
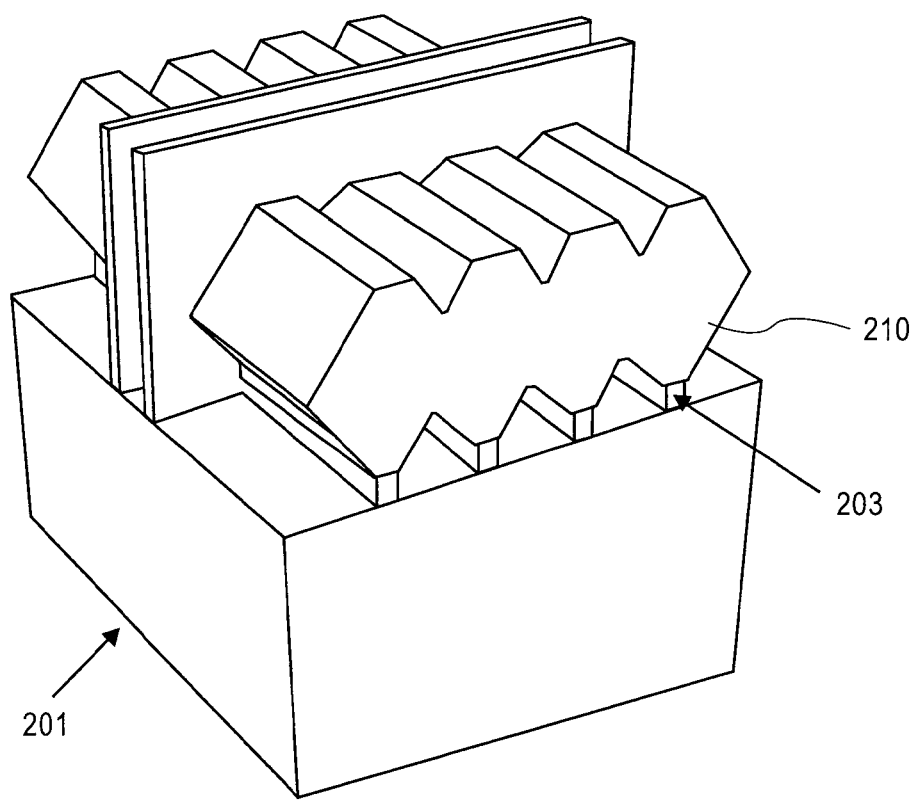
Figure 2C:
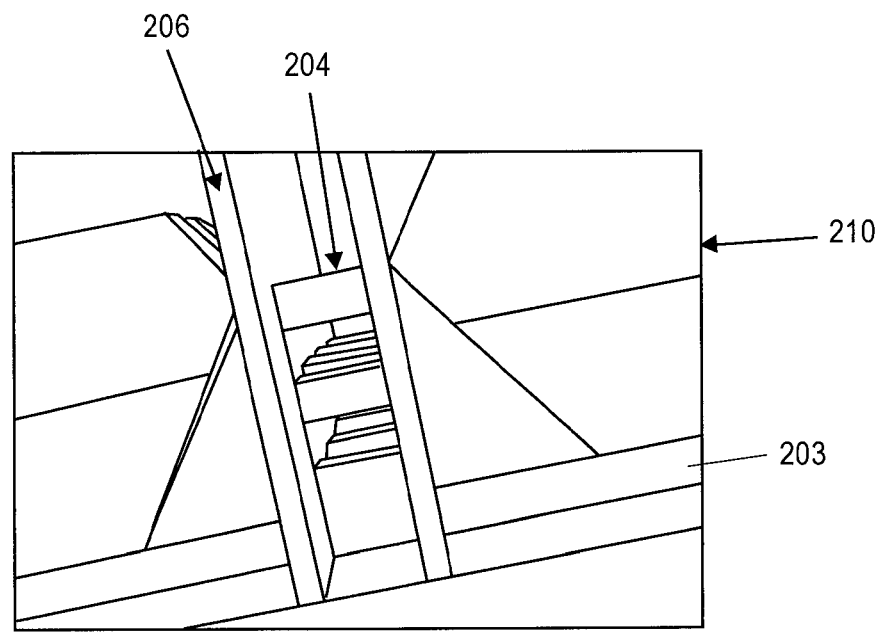

In an embodiment, devices fabricated according to the various embodiments herein may be provided with enhanced substrate isolation. Referring to FIG. 2a, a bottom nanowire channel 202 that is disposed on a substrate 200 may comprise a shorted trigate with poor subfin leakage, in some instances. One solution may comprise forming the device on a silicon on insulator (SOI) substrate 201 (FIGS. 2b-2c), wherein source/drain structures 210 and nanowire structures 204 are disposed on an insulator material 203, such as an oxide material 203, rather than being disposed on a bulk silicon substrate 200 (as depicted in FIG. 2a). By using a SOI substrate 201, the bottom nanowire 204 geometry can be defined by etching the bottom oxide after a silicon germanium etching of the nanowire fin structure (similar to the nanowire fin structure 107 of FIG. 1b, for example) and before forming the gate electrode material (similar to the gate electrode material 117 of FIG. 1l, for example).

Figure 2D:
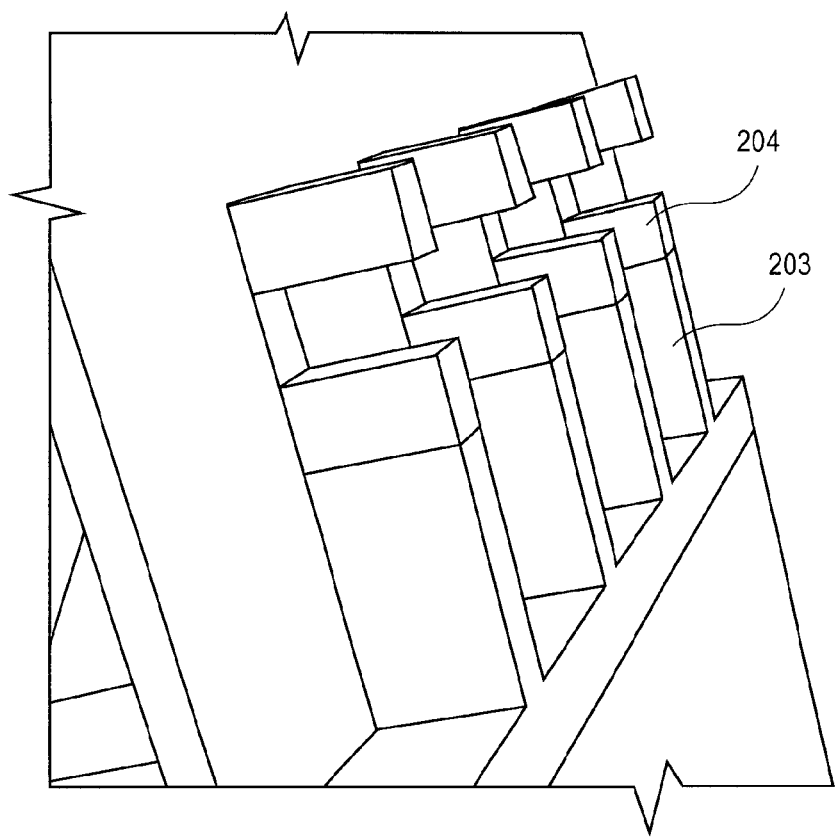
Figure 2E:
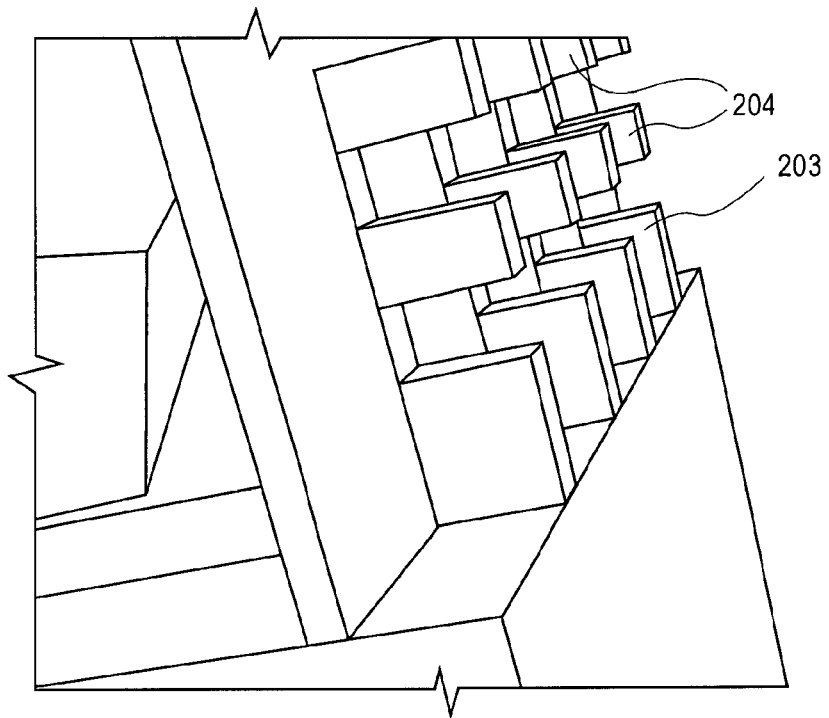
Figure 2F:
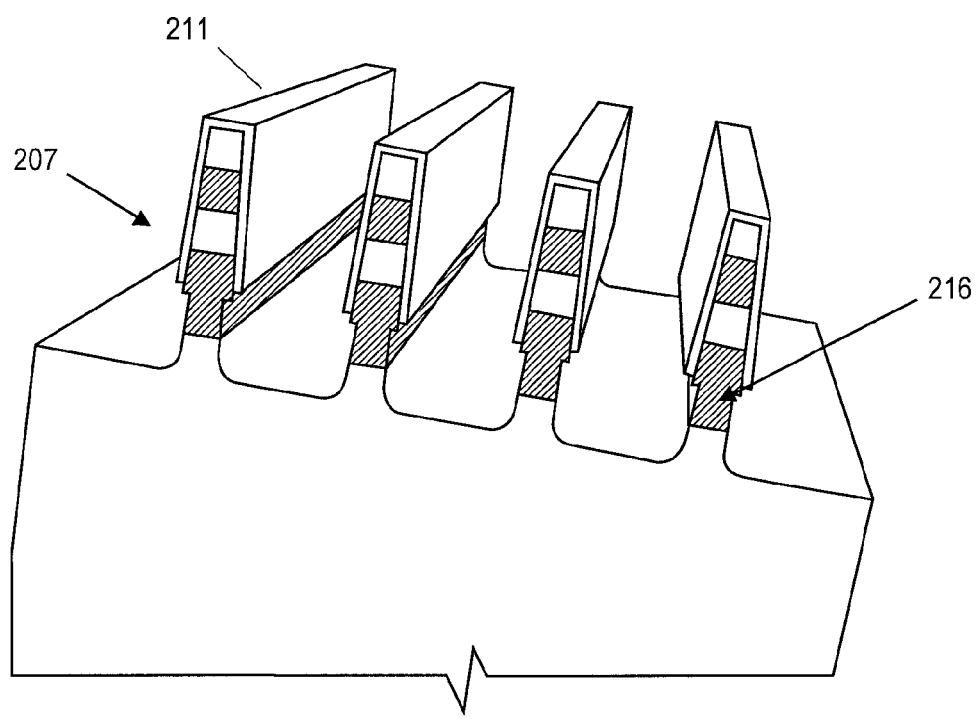
Figure 2G:
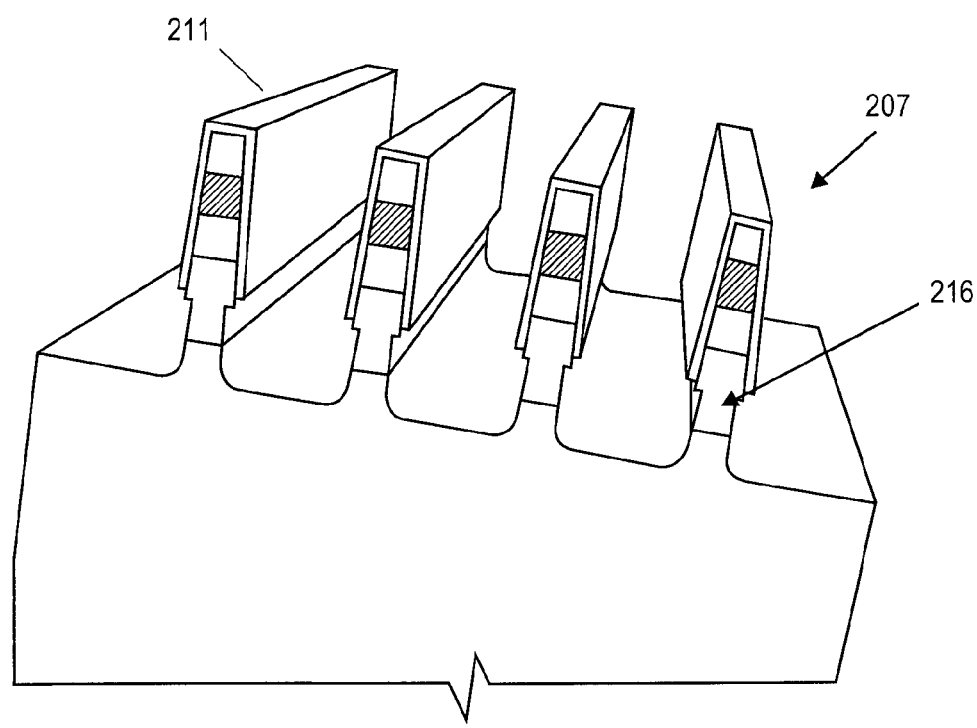
Figure 2H:
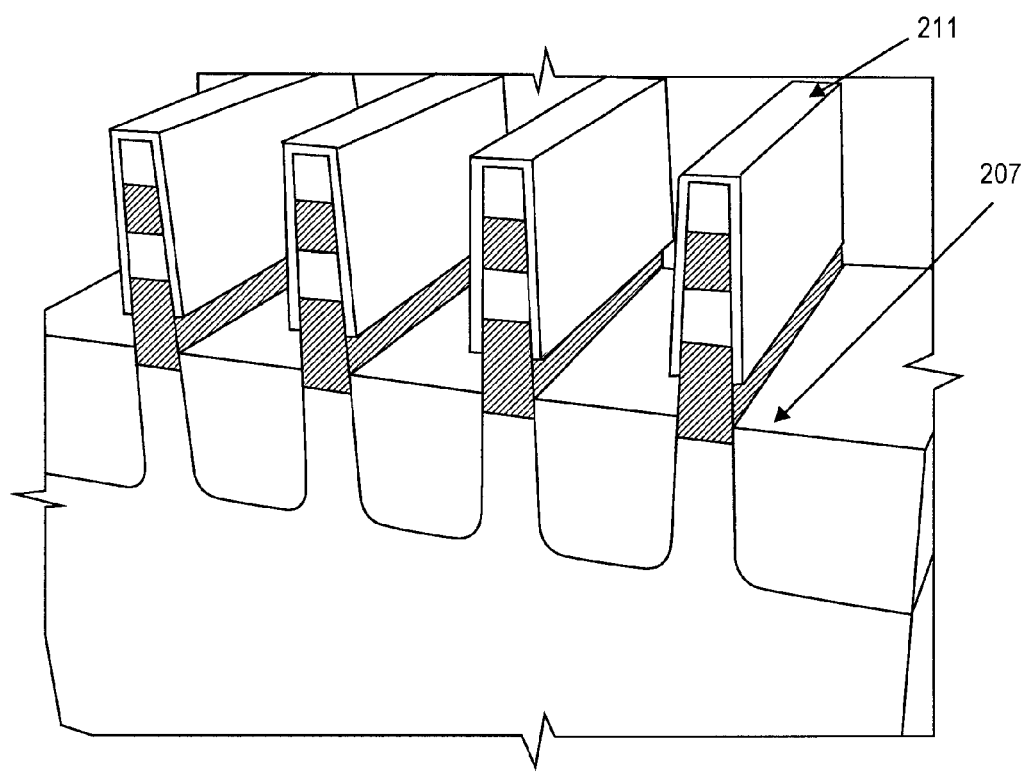
Figure 2I:
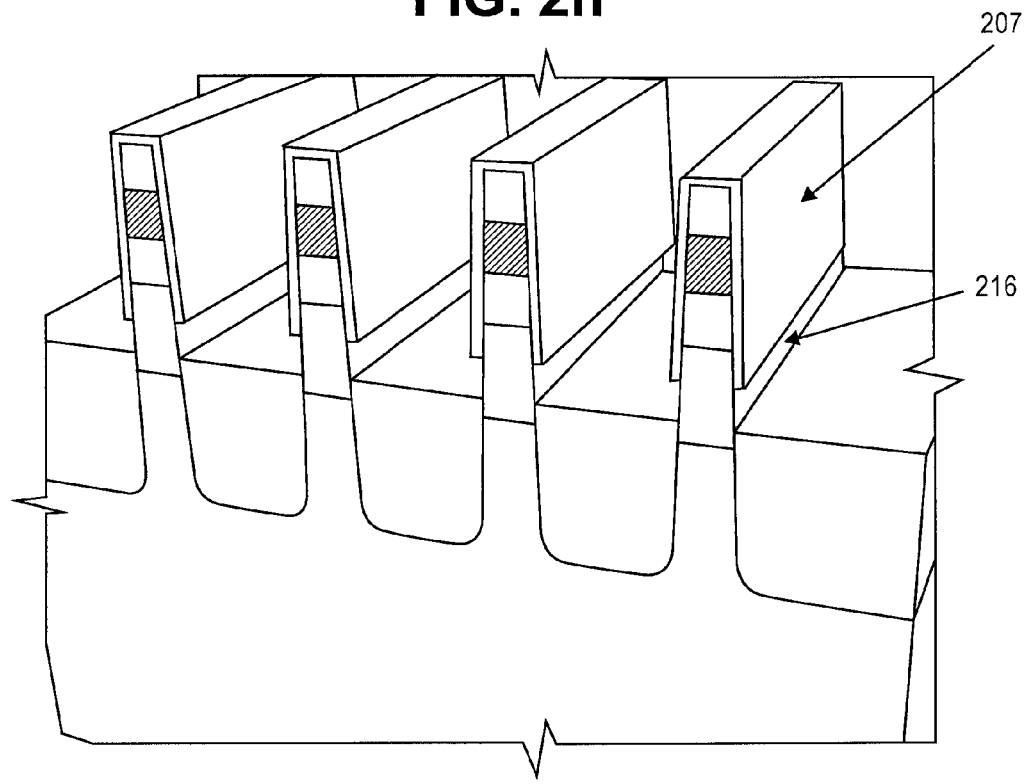

For example, FIG. 2d depicts etching the dielectric to form one nanowire and one trigate structure, while FIG. 2e depicts etching the dielectric to form a device comprising two nanowires. In another embodiment, enhanced substrate isolation may be achieved by forming fin spacers 211 on the fin 207 sidewalls after the trench etch (FIG. 2f). Then a second trench etch 214 may be performed to expose a bottom fin area 216, and the silicon portion of the bottom fin area 216 may be oxidized (FIG. 2g). Thus, a bottom nanowire of the device may be disposed on an oxide to improve substrate isolation. In another embodiment, fin spacers 211 may be formed on the fin 207 sidewalls after the trench etch and fill (FIG. 2h). The bottom silicon portion 216 of the fin 207 may be oxidized after the STI recess formation/oxide fill to enhance substrate isolation (FIG. 2i). Thus, a bottom nanowire of the device may be disposed on an oxide to improve substrate isolation.

Figure 3A:
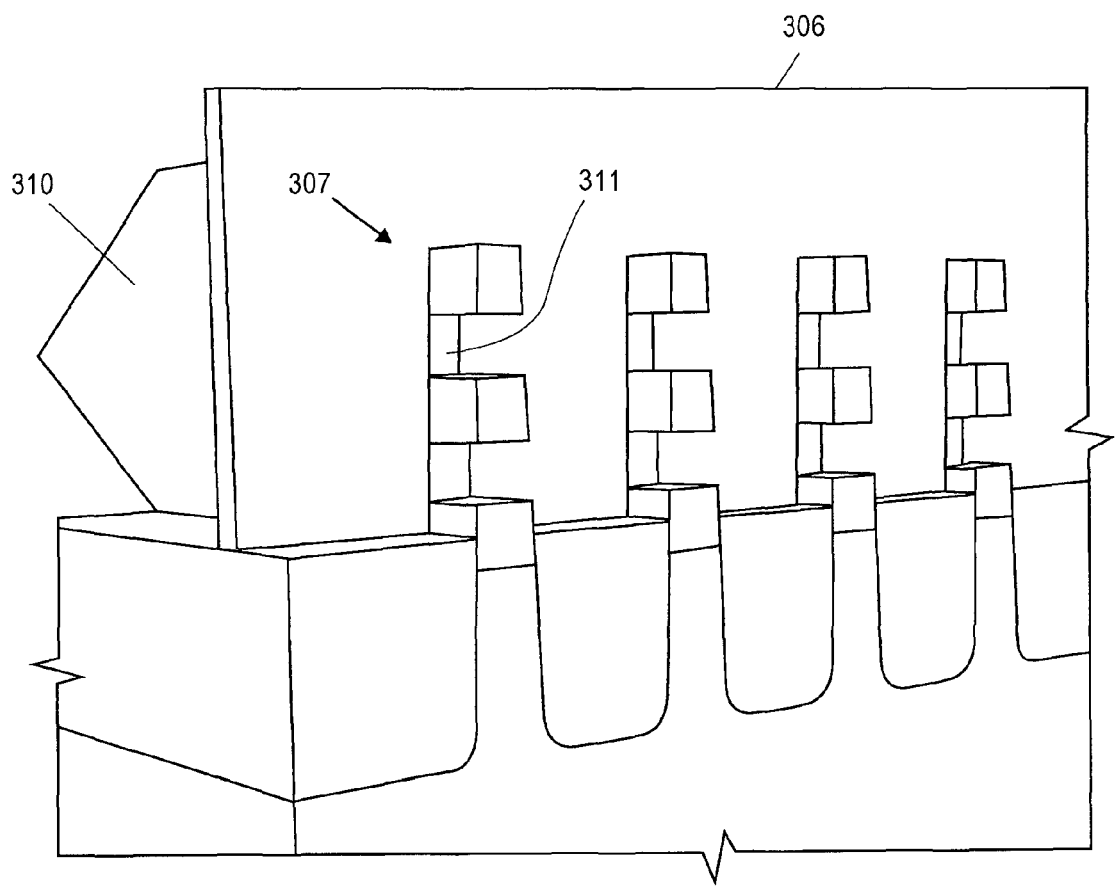
FIGS. 3a-3g represent methods of forming structures according to embodiments.
Figure 3B:
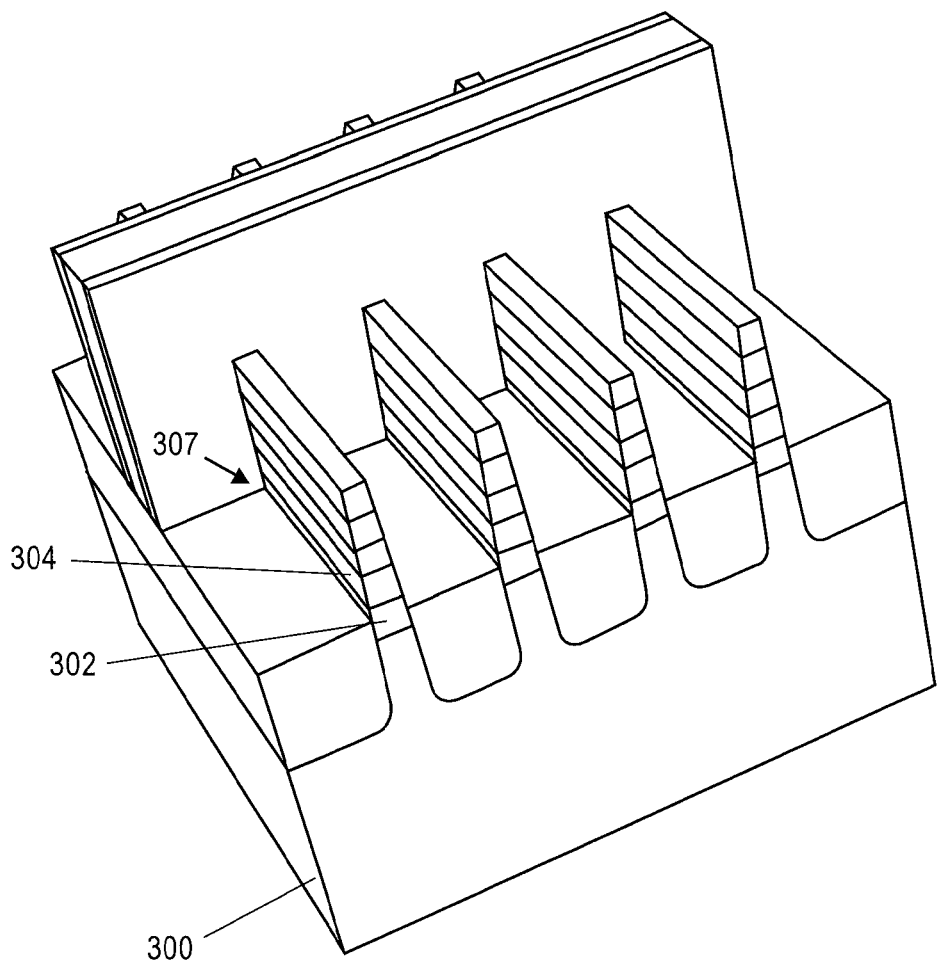

In an embodiment, there may be a gap 311 in a spacer 306 left by the removal of silicon regions of a nanowire stack 307 (FIG. 3a). After addition of a gate, such as a metal gate structure (similar to the gate structure 117 of FIG. 1l for example), the gap 311 may create a very high-capacitance parasitic region between the subsequently formed gate and the source drain structure 310. In an embodiment, the potential parasitic region may be avoided by utilizing an epitaxial oxide 302 for the starting stack, rather than silicon (which may or may not require an orientation change on the silicon substrate 300) (FIG. 3b). In an embodiment, alternating layers of an epitaxial semiconductor material 304 may be formed on an epitaxial oxide material 302 that may be formed on the substrate 300.

Figures 3C, 3D, 3E:
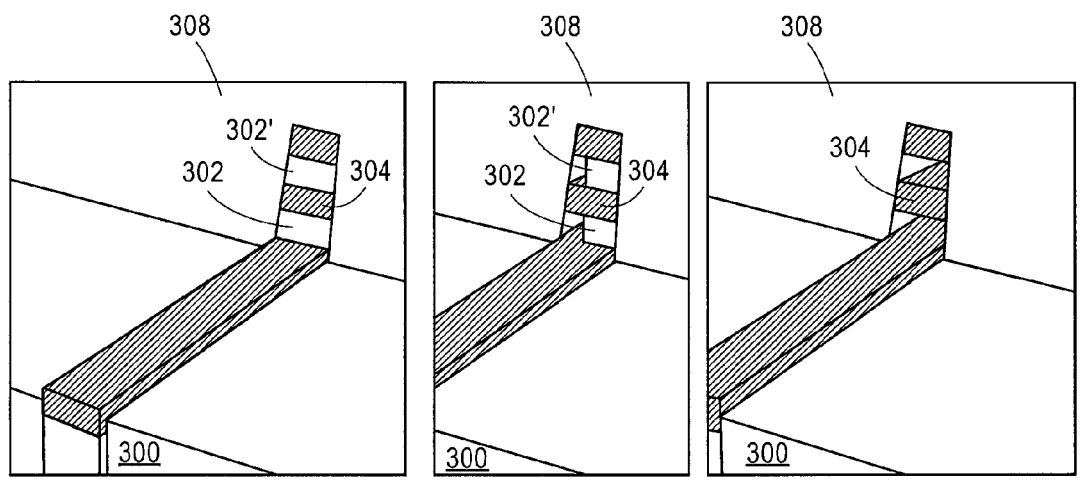

For example, a Gd2O3 can be grown epitaxially on (111) silicon, and silicon germanium can then be grown on top of the Gd2O3 to build up a multilayer stack on the substrate that can be etched into fin structures 307, that may be subsequently formed into silicon germanium wires. In another embodiment, cerium oxide may be grown on (111) silicon (or alternatively on (100) silicon) to form the multilayer stack. With an oxide/semiconductor/oxide stack there is the option to not etch, partially etch, or fully etch the oxide material 302, 302' of the fin structure 307 (FIGS. 3c-3e, respectively). The no etch option (FIG. 3c) resolves the capacitance issue, but at the cost of poorer confinement; the partial etch option (FIG. 3d) improves the confinement but at the cost of some level of parasitic capacitance.

Figure 3F:
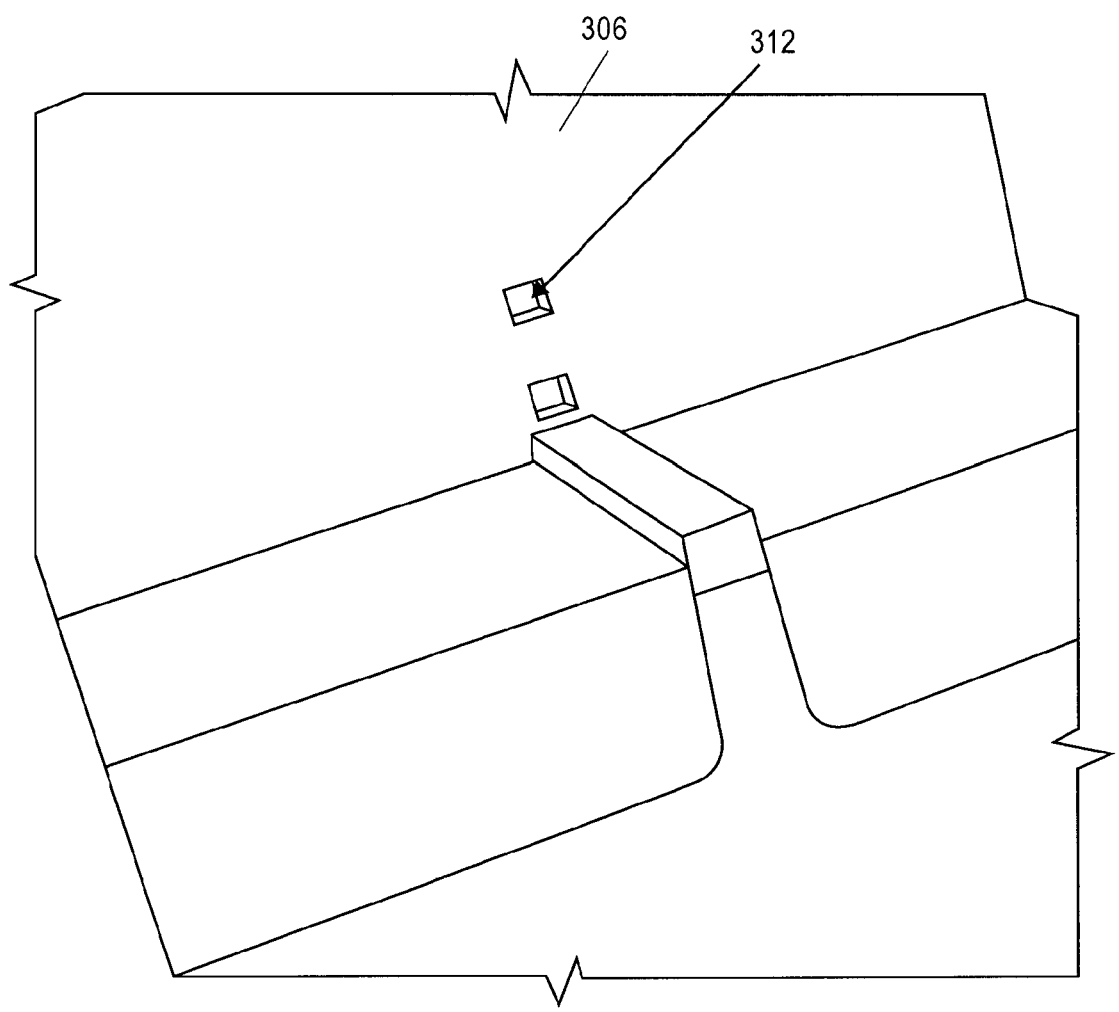
Figure 3G:
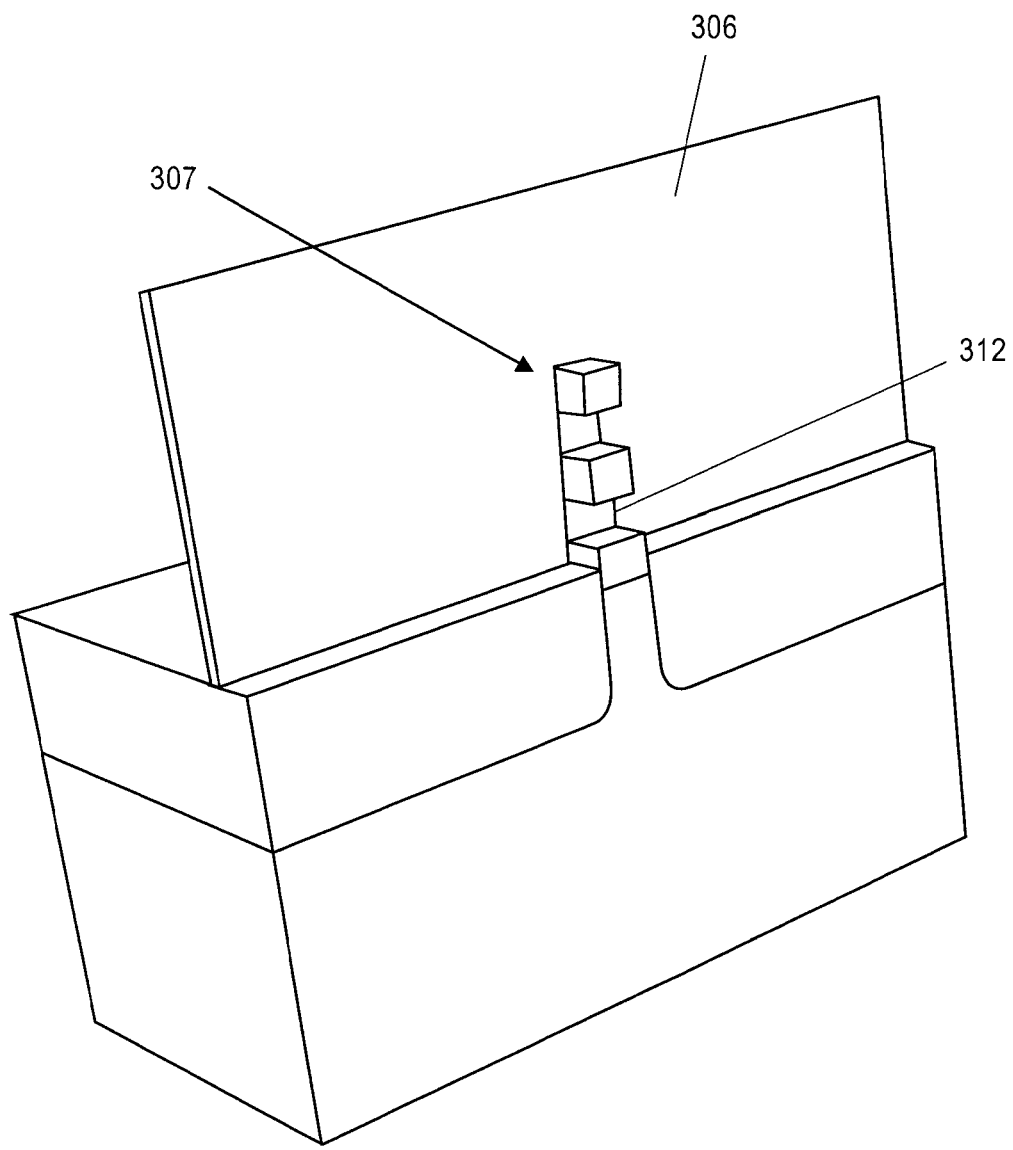

In another embodiment, the gap 311 in the spacers that is adjacent to the fin structures (depicted in FIG. 3a) may be filled with a second spacer 312 comprising spacer-like material 312 or a low-k material 312 from the source/drain 310 side of the spacer 306 prior to epitaxial growth of the source.drain (FIG. 3f). For example, materials such as but not limited to SiON, SiN, SiC, SiOBN, and low k oxides may comprise the second spacer 312 material. In one embodiment all of the silicon in the etch of the stack 307 may be removed, so that the replacement gate etch (removal of the sacrificial gate electrode material) only hits oxide. In another embodiment, only a portion of the silicon may be removed, so that the replacement gate etch actually etches silicon. In another embodiment, the gap 311 may be filled from the gate side (prior to gate deposition) with a spacer-like material 312 or a low-k material 312 (FIG. 3g). Embodiments include performing a full etch or partial etches of the stack 307 (shown as full etch).

In another embodiment, the gap 311 may be filled by exploiting the anisotropy of silicon etches to minimize the etch out of the silicon during the removal step from the stack 307. For example, a (110) wafer may be used with a channel along <111>. This structure will have slow-etching (111) planes facing the source/drain structures 310, thus limiting undercut. The wet etch selected here must also etch SiGe more slowly than Si, leaving a partially etched SiGe nanowire after removing all of the silicon between the SiGe nanowires. Thus, an anisotropic etch may be used to minimize lateral etching inside the spacer 306, wherein the etch chemistry is highly selective to silicon and not selective to silicon germanium.

Figure 4A:
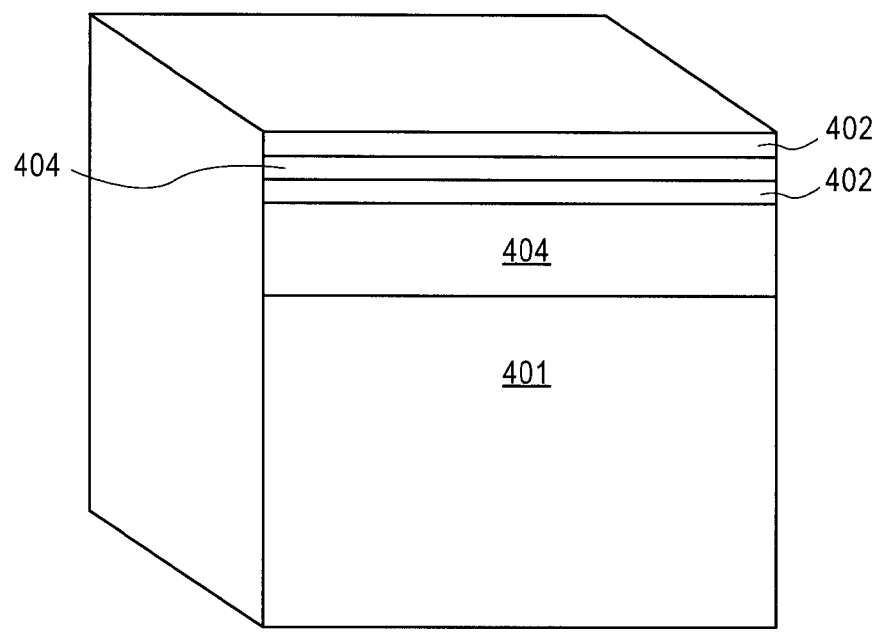
FIGS. 4a-4m represent methods of forming structures according to embodiments.
Figure 4B:
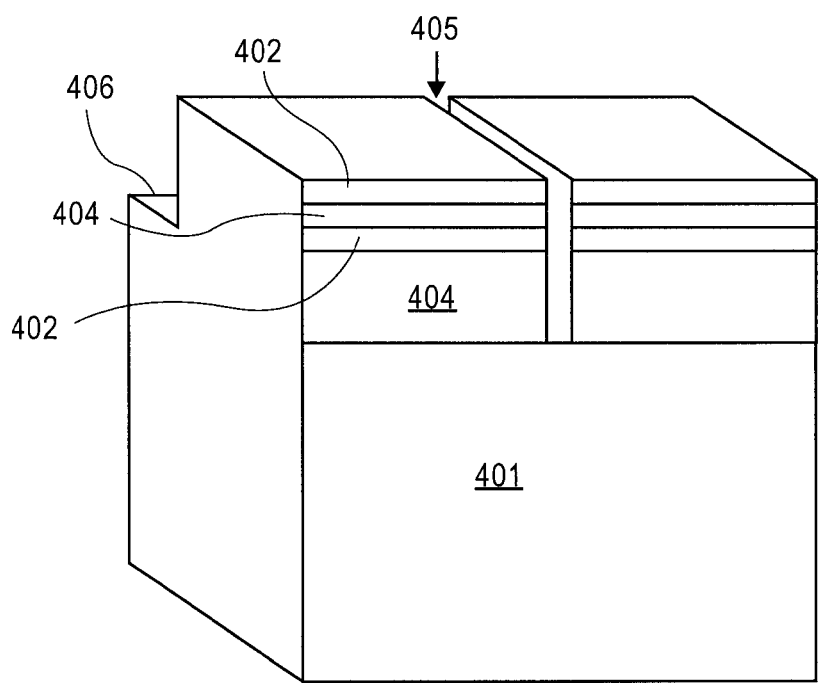
Figure 4C:
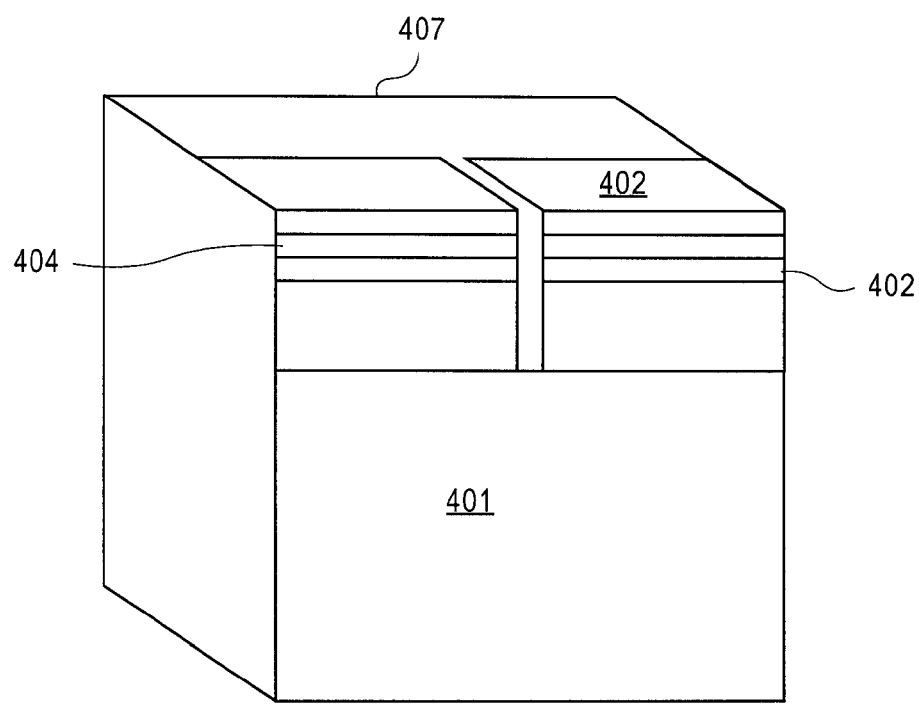
Figure 4D:
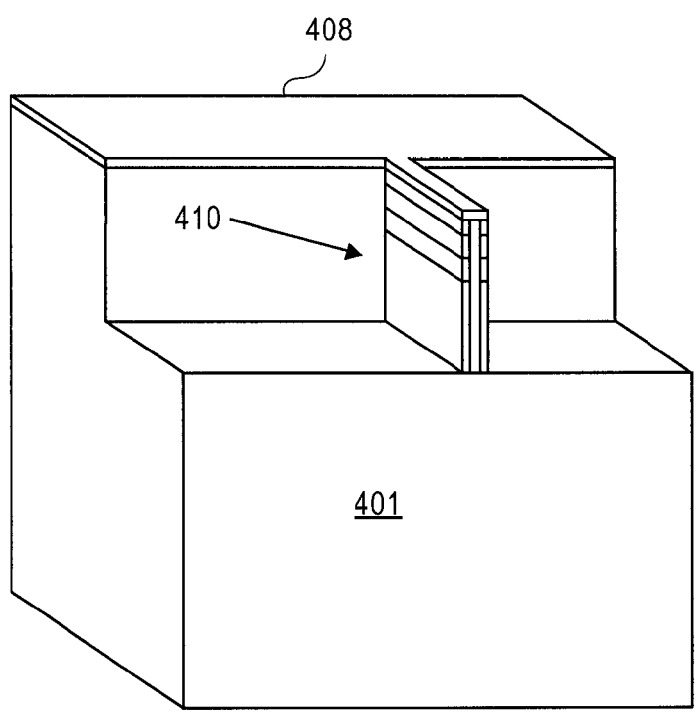

In an embodiment, vertical architecture scaling may be achieved utilizing nanowires. In an embodiment, silicon germanium or silicon may be epitaxially grown from a substrate into a trench, and then oxidation or etching processes, for example, may be used to separate fin structures into nanowires, wherein the nanowires may be stacked vertically upon each other. In an embodiment, oxidation for the entire wire, wherein the source/drain region starts out as layers of SiGe (or Si) and oxide) may be performed. Alternating oxide 404 and nitride layers 402 (more layers may be used to form more wires) may be formed on a silicon substrate 401 (FIG. 4a). The oxide and nitride layers may be patterned and etched to form a trench 405 and a back portion 406, wherein the trench 405 exposes the silicon material of the substrate 401 (FIG. 4b). Silicon germanium (or silicon) 407 may be grown epitaxially in the trench 405 and back portion, and may be polished (FIG. 4c). A hard mask 408 may be formed on the silicon germanium (or silicon) 407, and maybe patterned and etched to expose sides of fins 410 (FIG. 4d). In an embodiment, a fin structure may be formed by removing a portion of the alternating layers of nitride and oxide not covered by the hard mask.

Figure 4E:
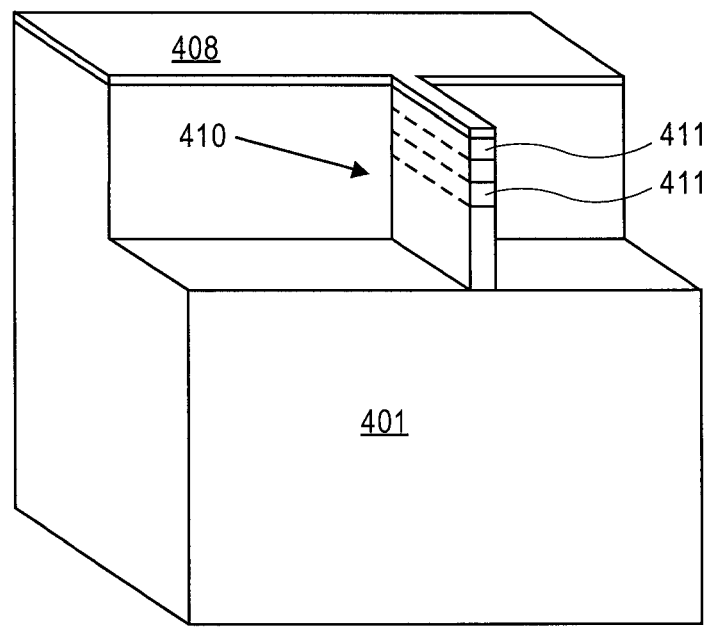
Figure 4F:
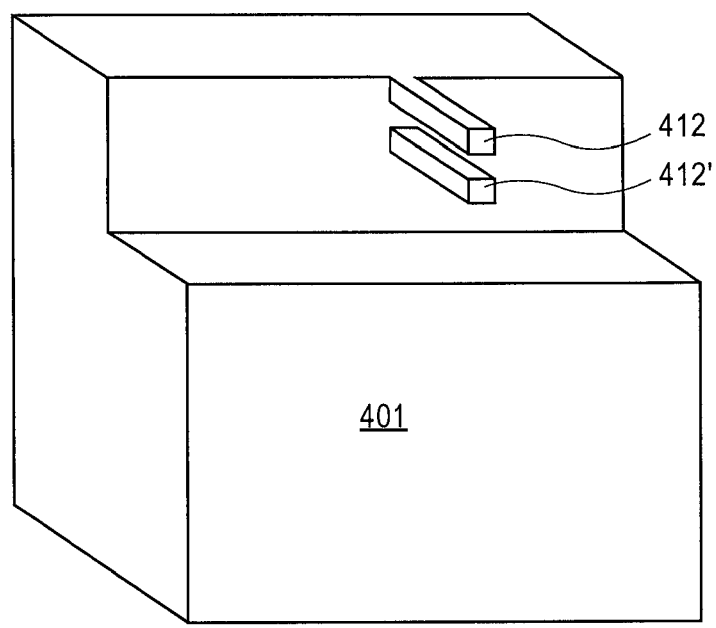
Figure 4G:
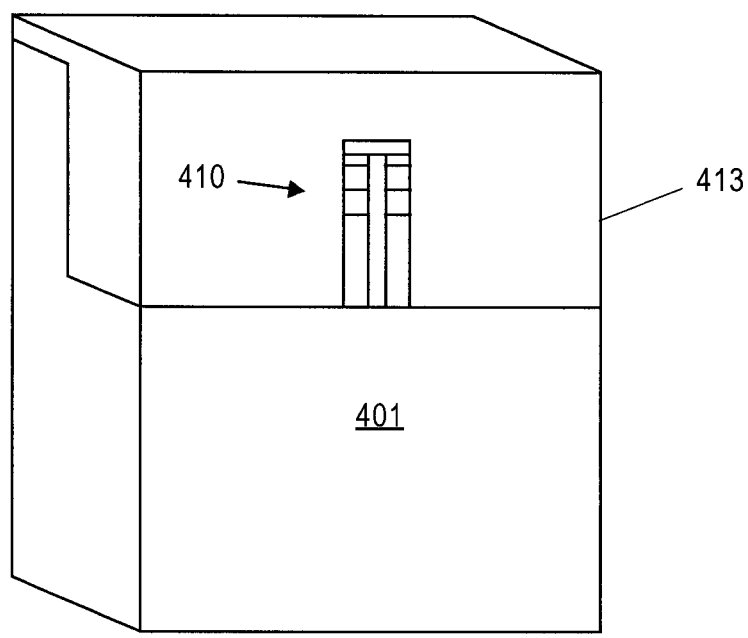
Figure 4H:
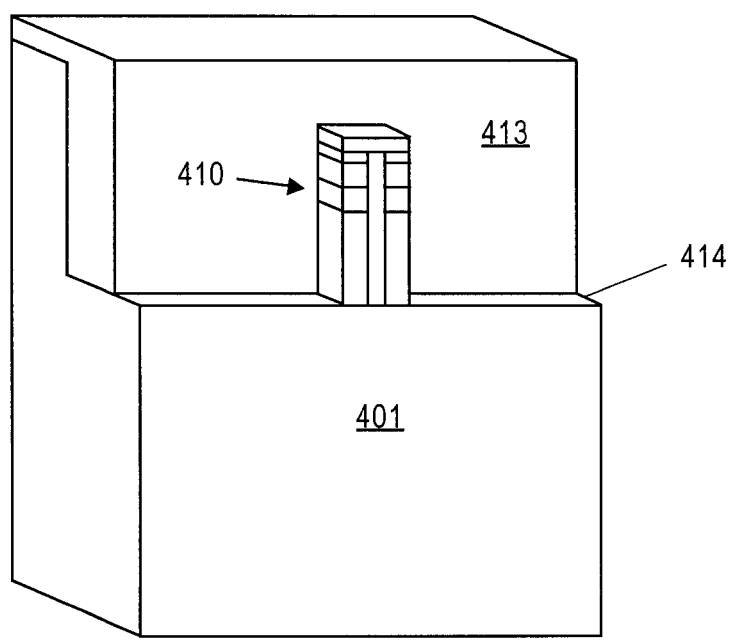
Figure 4I:
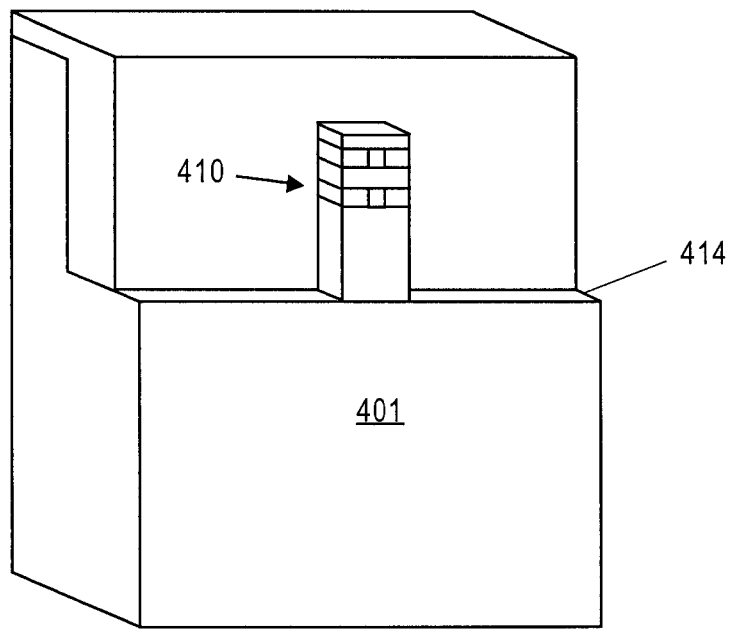
Figure 4J:
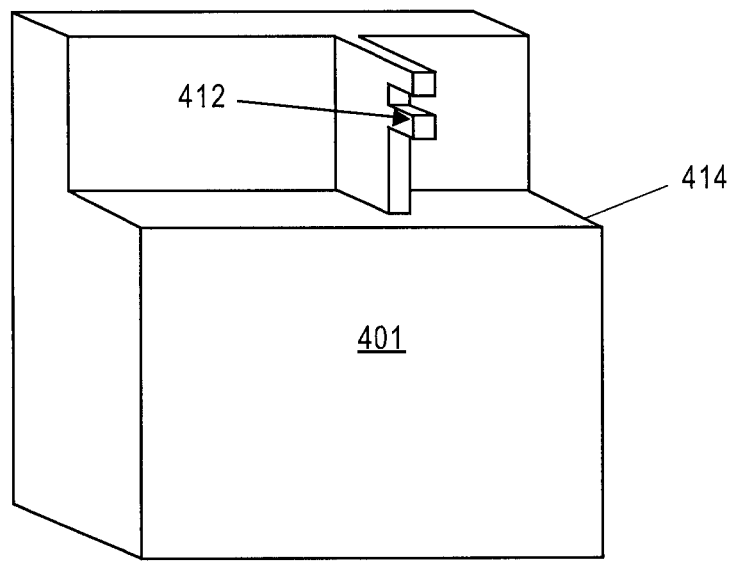

The fins 410 may be oxidized to define nanowires (FIG. 4e). The oxidized portions of the fins 410 may be removed to form the nanowires 412 which may serve as channel structures for a device, and may be formed across substantially the entire structure. In an embodiment, a first nanowire 412 may be disposed vertically above a second nanowire 412'. In another embodiment, the wires may only be defined in a channel region (FIG. 4g-4j). A second mask material 413, for example SiC, may be formed around a fin structure 410. The second mask material 413 may be selective to oxide and nitride. The fin structure 410 may comprise alternating oxide/nitride films, similar to those in FIG. 4d, for example. A trench 414 may be opened up to define a gate region adjacent to the fin structure 410, where a gate electrode material may be subsequently formed and wherein a portion of the fin structure 410 may be exposed (FIG. 4h). Oxidation may be performed to define the nanowires (FIG. 4i), and the wires may be further defined by removing the oxidized portions of the fin structure (FIG. 4j). Thus the wires are formed in the gate region/trench 414, but not in the source/drain region.

Figure 4K:
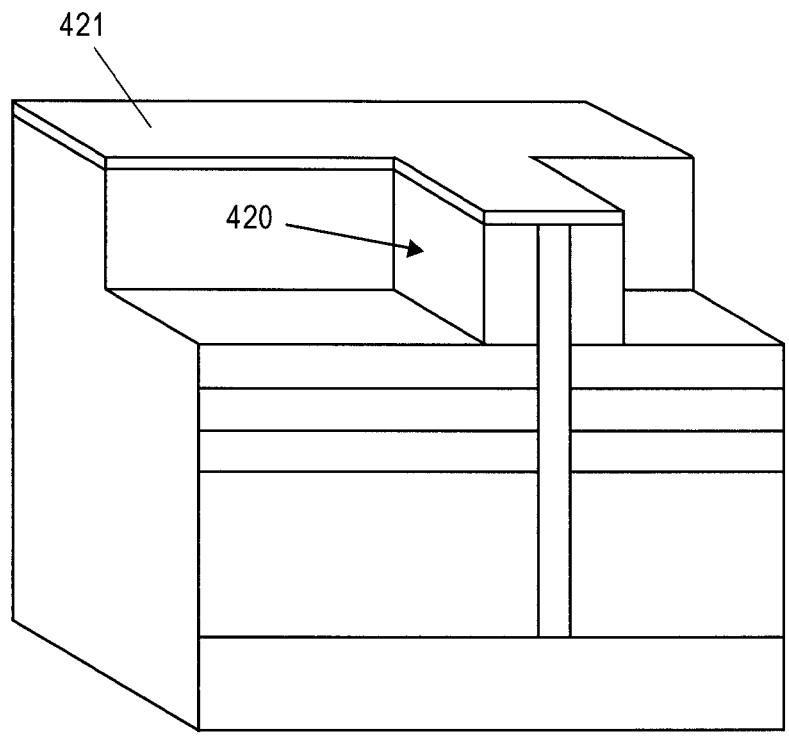

To ease the lithography concerns of patterning the nanowires, a spacer process can be used. Here, side portions of the Si or SiGe fin 410 may be exposed (while a top portion may be covered by a hard mask 421, such as SiC, for example) by etching the nitride surrounding it and a spacer 420 is formed by a combination of isotropic deposition and anisotropic etching (FIG. 4k). This spacer 420 is then used to mask the etch that exposes the sidewalls of the fins 410. The spacer 420 could then be removed.

Figure 4L:
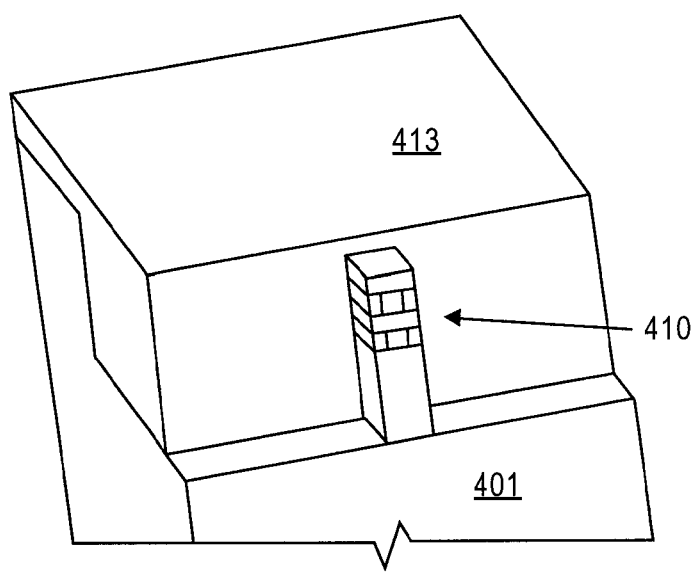
Figure 4M:
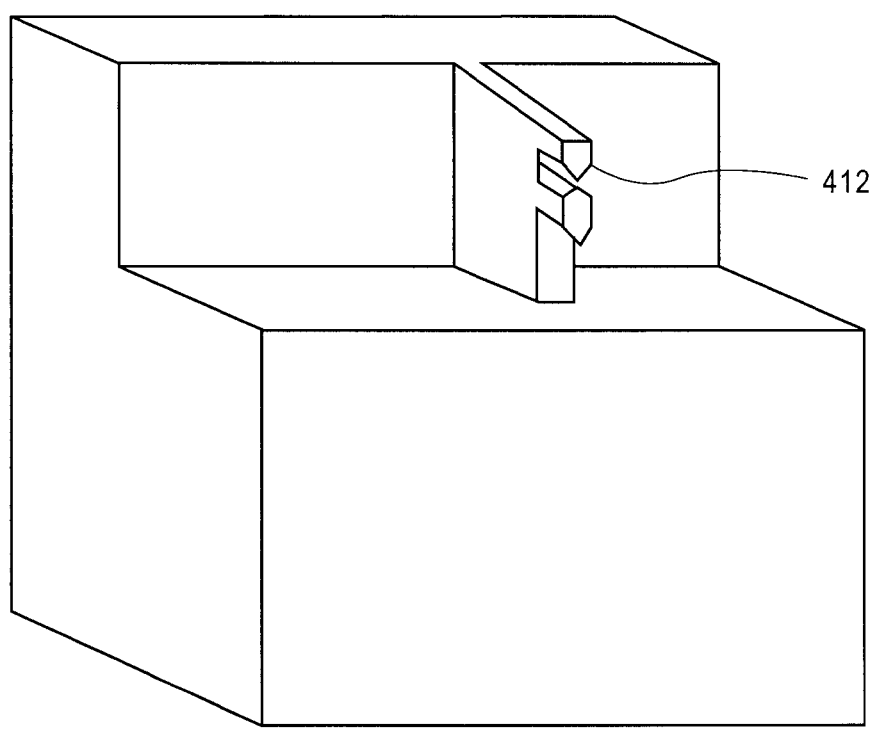

In another embodiment, an anisotropic wet etching separates the fins into wires as shown in FIG. 4l. First the oxide may be etched away using a wet etch. Subsequently a wet Si or SiGe anistropic etch may be used to etch the exposed SiGe or Si of the fin 410. Because of the dependence of the etch rate on the crystal direction, the nanowires may be formed. After both etches are performed, the nanowires may be formed in a hexagonal shape, in an embodiment. Si or SiGe fins may be formed after removal of the oxide (FIG. 4m).

Figure 5A:
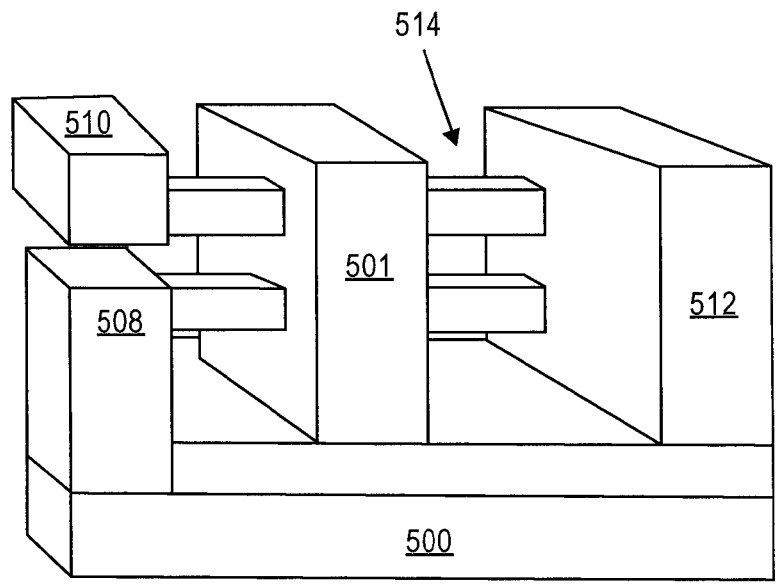
FIGS. 5a-5d represent methods of forming structures according to embodiments.
Figure 5B:
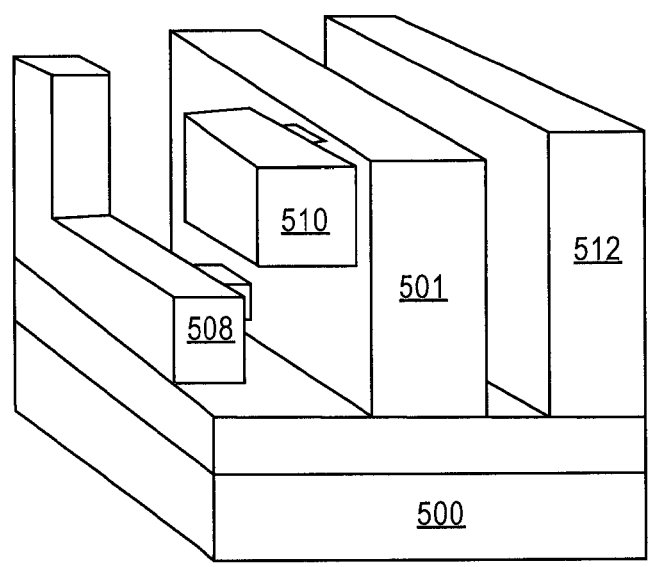
Figure 5C:
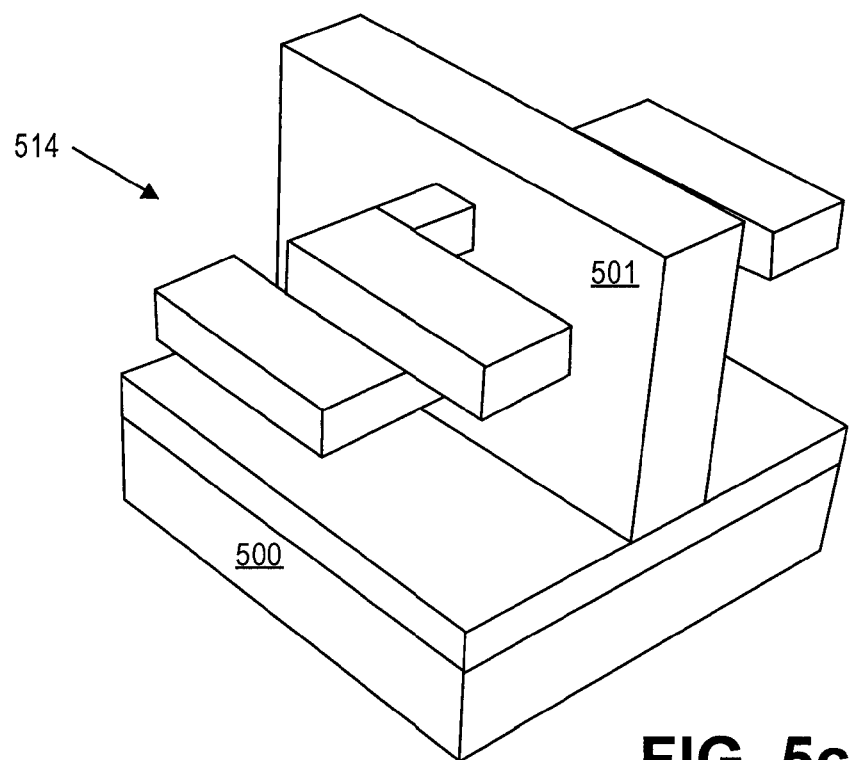
Figure 5D:
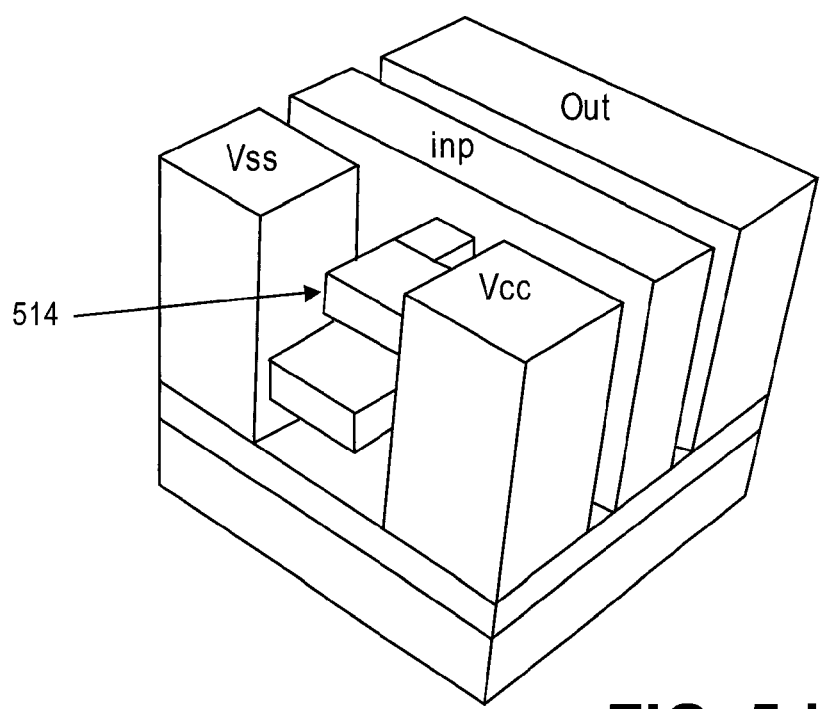

Vertical scaling of nanowires may be achieved. Since phonon scattering may limit the nanowire size to about 7 nm, this may limit the long term scaling of such devices. One solution is to construct the devices vertically, with either the N or P channel located in a bottom wire and the other channel located in a top wire. In an embodiment, an N+ substrate may be used for Vss. In another embodiment, top and bottom contacts may be misaligned. In another embodiment, wires with left and right wings may be formed. FIG. 5a depicts an inverter done with the N+ substrate 500 for Vss and gate 501. Note that this needs a tall contact 512 (TCN) to connect N and P nanowire channels 514, a short top TCN 510 to couple with one of the N and P nanowire channels 514, and a substrate plug 508/bottom TCN coupled to one of the N and P nanowire channels 514 and to the substrate 500. FIG. 5b depicts a misaligned top 510 and bottom 508 TCN. FIG. 5c depicts N and P nanowires in comprising left and right wing nanowire structures 514. FIG. 5d shows an inverter wired with the left and right wing nanowire structures 514.

Nanowires with GAA offer improvement over GAA non-nanowire structures, as well as fins, and trigate structures. The use of lateral nanowires with replacement metal-gate (RMG), gate-all-around processing is a logical extension of the roadmap from planar with RMG, to fins with RMG. Gate-all-around (GAA) nanowire structures offer the potential for improved short channel control over GAA non-nanowire structures and fins. Improved Isolation of the bottom wire in a silicon or silicon germanium nanowire structure from the substrate may be achieved according to embodiments herein.

Density scaling when the smallest nanowire size is limited to >~7 nm due to phonon scattering may be enabled. Lateral nanowire structures for both silicon and silicon germanium may be incorporated with replacement metal-gate architecture and manufacturing-compatible fabrication techniques for the wires modified from those developed for trigate structures. Vertical architecture scaling with nanowires is enabled. Building circuits in the transistor layer itself using nanowires is enabled herein.

Figure 6:
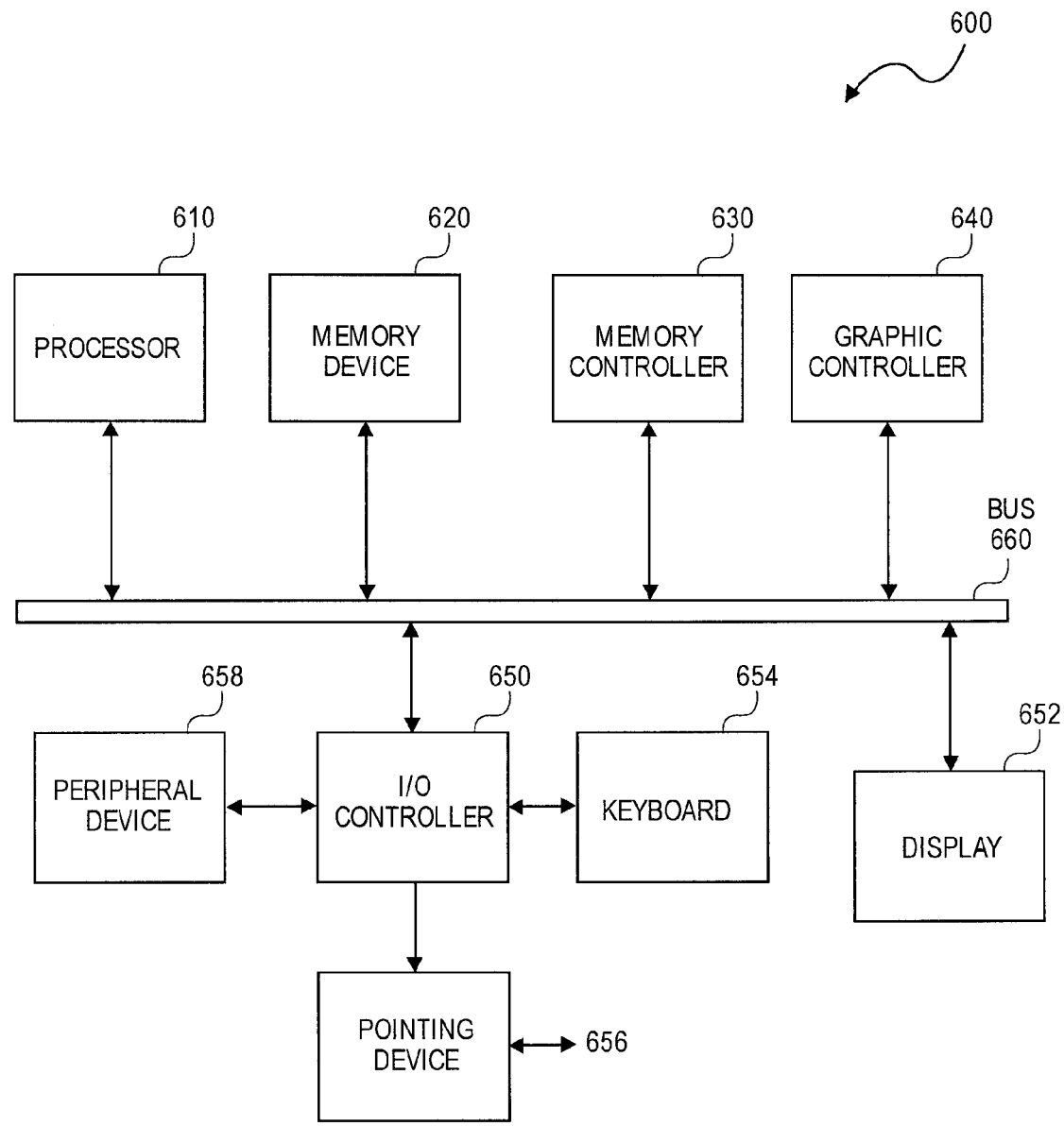
FIG. 6 represents a system according to embodiments.

FIG. 6 shows a computer system according to an embodiment. System 600 includes a processor 610, a memory device 620, a memory controller 630, a graphics controller 640, an input and output (I/O) controller 650, a display 652, a keyboard 654, a pointing device 656, and a peripheral device 658, all of which may be communicatively coupled to each other through a bus 660, in some embodiments. Processor 610 may be a general purpose processor or an application specific integrated circuit (ASIC). I/O controller 650 may include a communication module for wired or wireless communication. Memory device 620 may be a dynamic random access memory (DRAM) device, a static random access memory (SRAM) device, a flash memory device, or a combination of these memory devices. Thus, in some embodiments, memory device 620 in system 600 does not have to include a DRAM device.

One or more of the components shown in system 600 may include one or more nanowire devices of the various embodiments included herein. For example, processor 610, or memory device 620, or at least a portion of I/O controller 650, or a combination of these components may include in an integrated circuit package that includes at least one embodiment of the structures herein.

These elements perform their conventional functions well known in the art. In particular, memory device 620 may be used in some cases to provide long-term storage for the executable instructions for a method for forming structures in accordance with some embodiments, and in other embodiments may be used to store on a shorter term basis the executable instructions of a method for forming structures in accordance with embodiments during execution by processor 710. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 620 may supply the processor 610 with the executable instructions for execution.

System 600 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Although the foregoing description has specified certain steps and materials that may be used in the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, it is appreciated that various microelectronic structures, such as transistor devices, are well known in the art. Therefore, the Figures provided herein illustrate only portions of an exemplary microelectronic structure that pertains to the practice of the embodiments. Thus the embodiments are not limited to the structures described herein.

What is claimed is:

1. A nanowire device structure comprising:
a semiconductor substrate;
an N nanowire channel and a P nanowire channel vertically aligned above the semiconductor substrate, each having horizontally laterally opposed source and drain regions;
a tall contact to couple with N and P nanowire channels;
a short contact coupled to one of the N and P nanowire channels; and
a bottom contact disposed below the short contact coupled to one of the N and P nanowire channels and the bottom contact electrically coupled to the semiconductor substrate.

2. The structure of claim 1 wherein the semiconductor substrate comprises an N+ doped region coupled to Vss, and wherein the bottom contact is electrically coupled to the N+ doped region of the semiconductor substrate.

3. The structure of claim 1 wherein the short contact and the bottom contact are misaligned to one another.

4. The structure of claim 1 wherein the N and P nanowires comprise left and right wing structures.

5. A nanowire device structure comprising:
nanowire channel structures disposed vertically over a substrate, the nanowire channel structures having a top most nanowire channel structure and wherein the nanowire channel structures comprise one of a silicon nanowire and a silicon germanium nanowire;
a gate electrode, wherein a portion of the gate electrode is above the top most nanowire channel structure;
sidewall spacers adjacent to the gate electrode, wherein a portion of the sidewall spacers is laterally adjacent to the portion of the gate electrode above the top most nanowire channel structure; and
source/drain structures on either side of the nanowire channel structures, wherein a portion of the source/drain structures is laterally adjacent to the portion of the sidewall spacers laterally adjacent to the portion of the gate electrode above the top most nanowire channel structure.

6. The structure of claim 5 wherein the nanowire channel structures comprise a first nanowire disposed vertically over a second nanowire.

7. A nanowire device comprising:
a substrate;
nanowire channel structures disposed above the substrate, wherein the nanowire channel structures are vertically stacked above each other, the nanowire channel structures having a top most nanowire channel structure;
a gate electrode, wherein a portion of the gate electrode is above the top most nanowire channel structure;
sidewall spacers adjacent to the gate electrode, wherein a portion of the sidewall spacers is laterally adjacent to the portion of the gate electrode above the top most nanowire channel structure; and
source/drain structures on either side of the nanowire channel structures, wherein a portion of the source/drain structures is laterally adjacent to the portion of the sidewall spacers laterally adjacent to the portion of the gate electrode above the top most nanowire channel structure.

8. The nanowire device of claim 7 wherein the nanowire channel structures comprise epitaxial silicon nanowire channel structures that are separated from each other by a gap.

9. The nanowire device of claim 7 wherein the nanowire channel structures comprise epitaxial silicon germanium nanowire channel structures that are separated from each other by a gap.

10. The nanowire device of claim 7 further comprising wherein the gate electrode comprises a gate dielectric material all around the nanowire channel structures, and a metal gate surrounding the nanowire channel structures.

11. The nanowire device of claim 10 wherein the gate dielectric material comprises a high k gate dielectric material.

12. The nanowire device of claim 7 further comprising wherein the nanowire channel structures comprise one of epitaxial silicon and epitaxial silicon germanium.

13. The nanowire device of claim 7 further comprising wherein the source/drain structures comprise epitaxial silicon germanium.

14. The nanowire device of claim 7 wherein the substrate comprises a SOI substrate, and a bottom nanowire channel structure is disposed on an oxide portion of the SOI substrate.

15. The nanowire device of claim 13 wherein the substrate comprises a SOI substrate, and a bottom nanowire channel structure is disposed on an oxide portion of the SOI substrate.

16. The nanowire device of claim 7 further comprising a trench contact is coupled to the source drain structures, wherein the source and drain structures comprise n+ doped silicon, and wherein a silicon epitaxial tip is disposed between the source and drain structures and the substrate.

17. The nanowire device of claim 7 further comprising a trench contact couples to the source/drain structures, which comprises p+ doped silicon germanium, and wherein a silicon epitaxial tip is disposed between the source and drain structures and the substrate.

18. The nanowire device of claim 7 wherein the nanowire channel structures comprise an epitaxial silicon germanium nanowire channel disposed on an epitaxial oxide nanowire channel structure.

19. The nanowire device of claim 18 wherein the epitaxial oxide nanowire is partially etched.

* * * * *